(12) United States Patent
Ehrfeld et al.

(10) Patent No.: US 6,944,941 B2
(45) Date of Patent: Sep. 20, 2005

(54) METHOD FOR ASSEMBLING CASSETTE-LOADED MICROCOMPONENTS

(75) Inventors: Wolfgang Ehrfeld, Mainz (DE); Udo Berg, Bad Homburg (DE)

(73) Assignee: Institut fur Mikrotechnik Mainz GmbH (DE)

( * ) Notice: Subject to any disclaimer, the term of this patent is extended or adjusted under 35 U.S.C. 154(b) by 401 days.

(21) Appl. No.: 10/239,674

(22) PCT Filed: Mar. 30, 2001

(86) PCT No.: PCT/EP01/03642
§ 371 (c)(1),
(2), (4) Date: Sep. 24, 2002

(87) PCT Pub. No.: WO01/72467
PCT Pub. Date: Oct. 4, 2001

(65) Prior Publication Data
US 2003/0051339 A1 Mar. 20, 2003

(30) Foreign Application Priority Data
Mar. 31, 2000 (DE) .......................... 100 16 017

(51) Int. Cl.⁷ ............................. B23P 19/00; H05K 3/36
(52) U.S. Cl. ........................................ 29/729; 29/830
(58) Field of Search .................... 29/729, 759, 809, 29/428, 464, 466, 467, 525, 527.6, 557, 558, 33.52, 787, 238, 281.5, 830; 264/259, 239, 241

(56) References Cited
U.S. PATENT DOCUMENTS
6,851,174 B2 * 2/2005 Ehrfeld et al. ............. 29/527.1

FOREIGN PATENT DOCUMENTS
DE  195 35 971  4/1997
DE  197 09 136  9/1998
DE  198 40 387  10/1999

* cited by examiner

Primary Examiner—John C. Hong
(74) Attorney, Agent, or Firm—Hudak, Shunk & Farine Co. L.P.A.

(57) ABSTRACT

Disclosed is a method for assembling cassette-loaded microcomponents, requiring only a small number of component-specific ejector tools and capable of being implemented more quickly. According to the inventive method, at least two cassettes provided with component carriers are used, whereby each cassette has at least one type of component and the positions of the components are adapted to each other. At least one cassette acts as a base plate cassette wherein the microcomponents are arranged on a base plate acting as a component carrier. At least one joint assembly step is carried out, wherein two cassettes are respectively placed opposite each other and all microcomponents in the joined cassettes are simultaneously assembled to form sub-assemblies or component units. The component carriers of the cassettes are subsequently withdrawn. During assembly, the microcomponents can also be held in a rotationally secure position. The invention also relates to an assembly device for assembling cassette-loaded microcomponents.

17 Claims, 23 Drawing Sheets

METHOD FOR ASSEMBLING CASSETTE-LOADED MICROCOMPONENTS

FIELD OF THE INVENTION

The invention relates to a method for assembling cassette-loaded microcomponents and an assembly device in accordance with the claims.

BACKGROUND OF THE INVENTION

The typical current procedure for cassette-loading microcomponents is to deliver the components on carrier and transport devices so that they can be picked up from the carrier for the assembly process by means of special gripping tools. The individual components are delivered at a defined spacing depending on their structural shape, e.g. on tapes that are adhesive on one side (blue tape), or they are fixed in the proper position by gel in gel packs (F+M Feinwerktechnik Mikrotechnik Mikroelektronic 105, 1997, 43–45). Other methods consist of placing the microcomponents in the correct position for gripping in chessboard-like indentations of rectangular tablets or in modularly constructed cassettes. (41st International Scientific Council of the Technical University [TU] of Ilmenau, Sep. 25, 1996). The ordering system allows for defined gripping or removal of these parts from the carrier.

The drawback with these methods, however, is that frequently the ordering system of the production process is not used for the relative positioning and ordering of the parts. Instead the microcomponents are initially delivered in bulk and are then placed onto the aforementioned conveyors in the correct position ready for gripping, which is a time-consuming process. As a result, an intermediate step after the production process is required for cassette loading, the complexity of which is significant and comparable to the subsequent microassembly step.

To simplify the handling of microcomponents, so called foil cassettes were developed, which are described in the German Laid Open Publication DE-OS 197 09 136. These are disk-shaped plates in which the microcomponents are integrated in such a way that they are enclosed along their lateral surfaces in a form-fitting manner. The disk-shaped plate, or the cassette material surrounding the microcomponents, thus forms the component carrier. These foil cassettes with microcomponents are produced by first forming elevations on a component base plate made of the same material by means of vacuum casting, injection molding, reaction molding, or hot stamping. Subsequently, the microcomponents are encapsulated by means of a molding material that solidifies. Thereafter, the microcomponent base plate and, where applicable, the molding material covering the microcomponents, is removed so that the end faces of the microcomponents are exposed.

To assemble the microcomponents, the cassette is grasped and positioned such that the respective microcomponent to be mounted is at the intended location where it is e.g. connected with another microcomponent. To this end, the microcomponent must be pushed out of the foil cassette and pressed onto the existing microcomponent.

For foil-cassette loaded components, various preparation steps are required prior to the actual assembly process as a function of the component geometry and the assembly task.

In the case of ring-shaped or sleeve-shaped components, cassette cores must be removed. It is not possible to eject these cores during assembly by means of the structures of the mating component particularly if the mating component is made of plastic because its buckling strength is not sufficient. Due to the relatively large forces that must be applied to separate the component from the cassette, the cores must be removed by means of metal tools prior to the assembly process.

The ejection of microcomponents from foil cassettes can in part require considerable forces. These forces are highest at the beginning of the ejection process, since the microcomponents must first be detached from the cassette material. Microroughnesses, which must be sheared off by the relative movement between component and cassette, are presumed to be the cause. At the same time, a stick/slip effect is observed, i.e. after static friction has been overcome during ejection, the lower sliding friction occurs.

To reduce the ejection force during the assembly process, the microcomponents, which are removed from the cassette in assembly direction, are therefore first partially pushed out of the cassette in preparation of assembly.

To eject the microcomponents from the cassette, component-specific tools (ejector pins) are required.

The maximum cross-sectional area of the tool is determined by the size of the end face area of the microcomponent and the tolerance of the assembly machine. For instance, in the case of circular cross sections, the maximum tool diameter corresponds to the smallest diameter of the end face minus twice the positioning accuracy of the machine. The minimum length of the ejection tool is determined by the thickness of the foil cassette. With increasing height of a microcomponent, the adhesive forces to be overcome are consequently greater and the ejector pin must be longer, so that the buckling resistance of the tool is reduced. This sets a physical limit to the usability of foil cassette loading with respect to the realizable aspect ratio.

The component geometry dictates the removal direction for the ejection of the microcomponent from the cassette, whereas the assembly task determines the assembly direction.

Components that can be removed in assembly direction can be assembled directly from the cassette with the mating components. Components that can be assembled directly are cylindrical components and those whose thickness increases in assembly direction.

In contrast, components that taper in assembly direction must first be removed from the foil cassette opposite to the assembly direction. To this end, the microcomponents must be fixed in a component-specific device, e.g. by applying a vacuum. This device serves for interim storage until the assembly mates receive the components or, in the case of basic components, until the subassembly is finished. The handling of such components is therefore substantially more complex than for components that can be removed in assembly direction.

SUMMARY OF THE INVENTION

The object of the invention is to provide a method and a device for assembling cassette-loaded microcomponents, which will require fewer component-specific ejection tools and which can be performed faster.

This object is attained by a method characterized in that at least two cassettes each provided with component carriers are used, each with at least one type of component and with mutually adjusted component positions. At least one of these cassettes is a base plate cassette in which the microcomponents are arranged on a base plate as a component carrier. At least one assembly step is performed in which two cassettes are arranged on opposite sides, respectively, and a plurality of microcomponents in the two cassettes in the cassette system is assembled simultaneously into subassemblies or component units. Subsequently, the component carriers of the cassettes are removed.

The parallel assembly of the microcomponents in the cassette system from the cassettes makes it possible to produce a plurality of subassemblies in a shorter time. A time-consuming individual assembly of the microcomponents is eliminated. The microcomponents are already positioned with a defined degree of order within the cassette during the production process so that only the cassettes need to be mutually aligned. This makes it possible in a single process step simultaneously to align and mutually position a plurality of microcomponents that are to be assembled.

The preferred production process for the base plate and the microcomponents is injection molding and/or hot stamping. Here, the microcomponents and the base plate can be made of the same material, and the base plate serves as the sprue plate. To produce the microcomponents and the base plate from different materials, a so-called two-component injection molding process is suitable in which, for instance, the microcomponents are injection molded first and a base plate is subsequently molded onto the microcomponents. The microcomponents may be connected over their entire surface or a partial surface.

These base plate cassettes have the advantage that the microcomponents can first be connected with additional microcomponents and that the base plate can be removed mechanically at a subsequent point in time. The use of base plate cassettes eliminates the need for foil cassettes, which require double-sided mechanical processing and high ejection forces. Since the forces during the assembly can be applied to the entire base plate cassette and thus over a large surface, no component-specific ejection tools are required.

Depending on the assembly task, base plate cassettes are used exclusively or base plate cassettes are combined with foil cassettes. It has been shown that with a decreasing number of foil cassettes the cost up to assembly can be substantially reduced.

All assembly tasks, however, require at least one base plate cassette, which is preferably used as the basic cassette. This basic cassette is inserted into an assembly device and other microcomponents from other cassettes in the cassette system are successively mounted to the microcomponents located on the base plate. Thus, components of the basic cassette and microcomponents of an additional cassette are involved in each assembly step. This means that the basic cassette remains intact until the subassembly, which may be an intermediate product or a final product, i.e. a microcomponent unit such as a microgear unit, is completed. Only after completion of the assembly task is the base plate of the basic cassette mechanically removed.

If foil cassettes are used it is advantageous to remove any component cores in a separate process step in order to reduce the assembly forces and to protect the corresponding assembly mates. The microcomponents of the foil cassette in the cassette system are preferably pressed onto the microcomponents of the opposite cassette and the component carrier of the foil cassette is subsequently detached from the microcomponents. It is also possible to use foil components that are produced in a two-component injection molding process, in which case the component carrier is produced with adhesive contact on parts of the lateral surfaces.

If base plate cassettes are used, they are pushed together to assemble the microcomponents. Preferably, the assembled microcomponents are embedded in a fixation compound and the base plate of one of the two base plate cassettes is subsequently removed. Suitable fixation compounds are, for instance, compounds that can be dissolved chemically or thermally, e.g. wax. The base plate is preferably removed by milling, turning or grinding.

Once the assembly process is thus completed, the base plate of the basic cassette is also removed and the fixation compound forms a subassembly cassette, preferably in the form of a foil cassette, which is used to transport the subassembly made of the two or more microcomponents.

If the assembly process is to be continued, the fixation compound, but not the base plate of the basic cassette, is removed such that the subassemblies are exposed and can receive additional microcomponents, which are mounted in additional assembly steps from foil or base plate cassettes. The subassemblies or component units thus produced can all be embedded in a fixation compound, which in this case forms the subassembly cassette.

In some component units, e.g. microgear units, it is crucial e.g. in automated assembly that at least a portion of the microcomponents is secured against rotation. This is important, for example, for gears that must be assembled with other gears in a further assembly step.

Preferably, the microcomponents are secured by means of fixation structures located on the base plate of the basic cassette and/or by means of fixation structures of an assembly device.

The microcomponents are preferably secured against rotation until the subassemblies, or the component units, or the subassembly cassette are completed.

Microcomponents may also include optical fibers and the associated connectors. These optical fibers can be fixed at one end in a foil cassette and arranged in parallel to one another.

The associated connectors or connector parts, which are disposed, for instance, on a base plate cassette, are provided with grooves along their top surface into which the optical fibers are inserted.

The method according to the invention makes it possible to interconnect fibers and connectors by performing a single assembly step in which the fiber cassette is arranged opposite the connector cassette and a plurality of fibers and connectors in the cassette system are assembled into component units in the form of fiber/connector units.

Subsequently, the component carriers of the two cassettes are removed.

The assembly device according to the invention for assembling cassette-loaded microcomponents of a plurality of microcomponent types into subassemblies or component units, particularly microgear units, is characterized by a lower tool with an assembly plate, which is configured to receive a base plate cassette. Assembly pins that can be moved perpendicularly to the plate surface are arranged in this assembly plate. The assembly device further comprises a movable upper tool with fastening means for a base plate cassette or a foil cassette.

Preferably, the assembly pins are provided with fixation structures at least in their free end area.

The upper tool is preferably provided with ejector elements. This is important if the upper tool carries a foil cassette.

BRIEF DESCRIPTION OF THE DRAWINGS

Exemplary embodiments of the invention will now be described in greater detail with reference to the drawings in which.

DETAILED DESCRIPTION OF THE INVENTION

Figure 1:
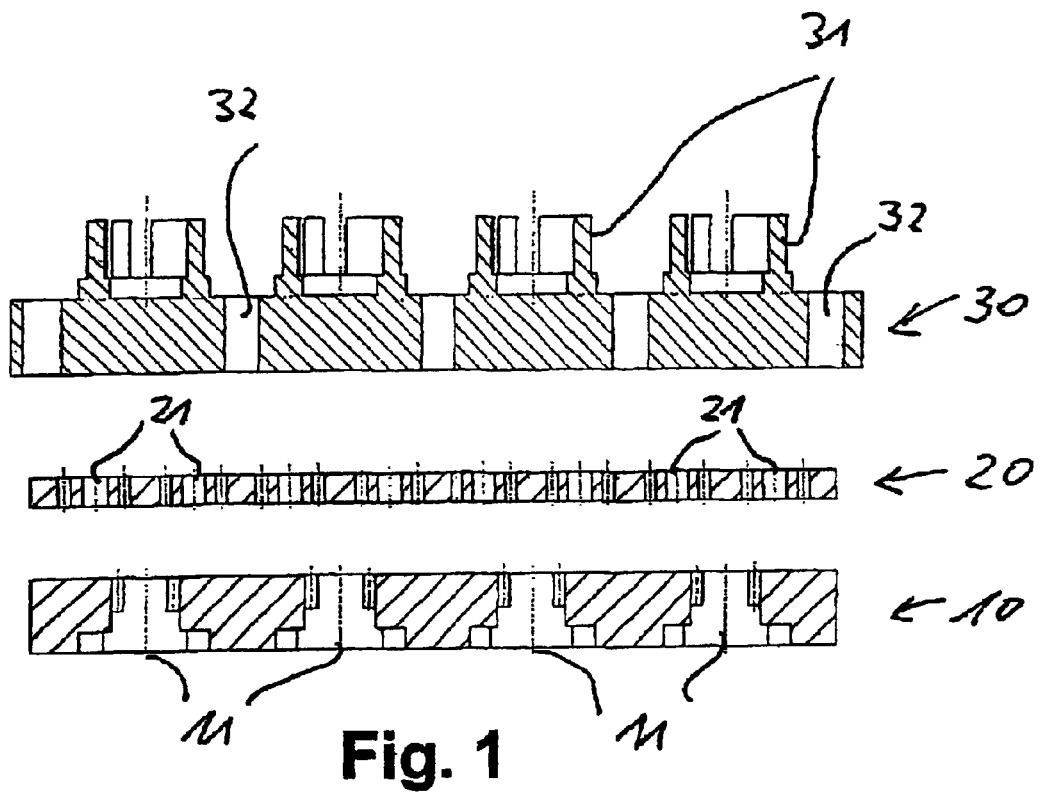
FIGS. 1–7 illustrate the process steps for the preassembly of a microgear unit according to a first embodiment.

FIG. 1 depicts a first and a second foil cassette 10, 20 and a first base plate cassette 30. Each cassette is provided with one type of microcomponents. The first foil cassette 10 contains microcomponents 11 of a first type in the form of upper web parts. The second foil cassette 20 contains microcomponents 21 of a second type in the form of planetary gears, and the base plate cassette 30 comprises a base plate as a component carrier with positioning holes 32 and microcomponents 31 of a third type in the form of lower web parts.

These three cassettes, 10, 20 and 30 are combined with one another in the following assembly processes such that after assembly the microcomponents form a planetary gear unit.

Figure 2:
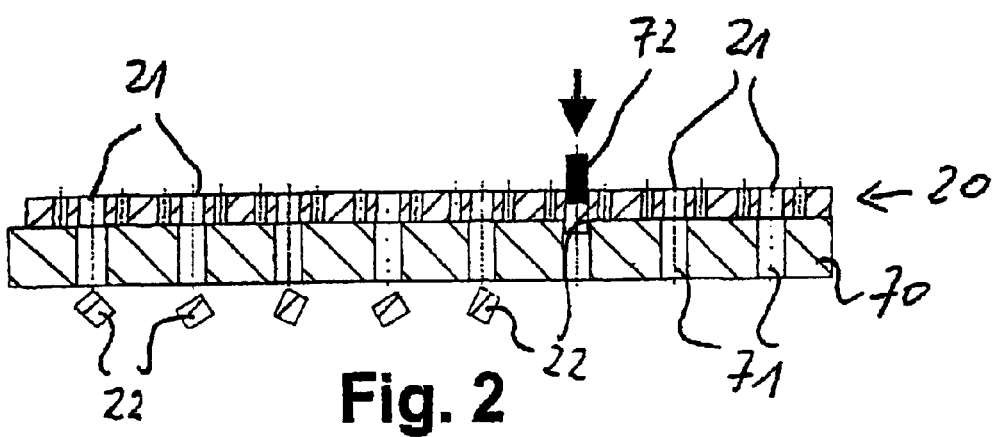

First, however, component cores 22 located in gears 21 are removed (see FIG. 2). For this purpose a perforated plate 70 is provided with openings 71 through which the component cores 22 are pushed by means of an ejector pin 72. It is also possible to provide a combined tool with a plurality of ejector pins 72.

Figure 3:
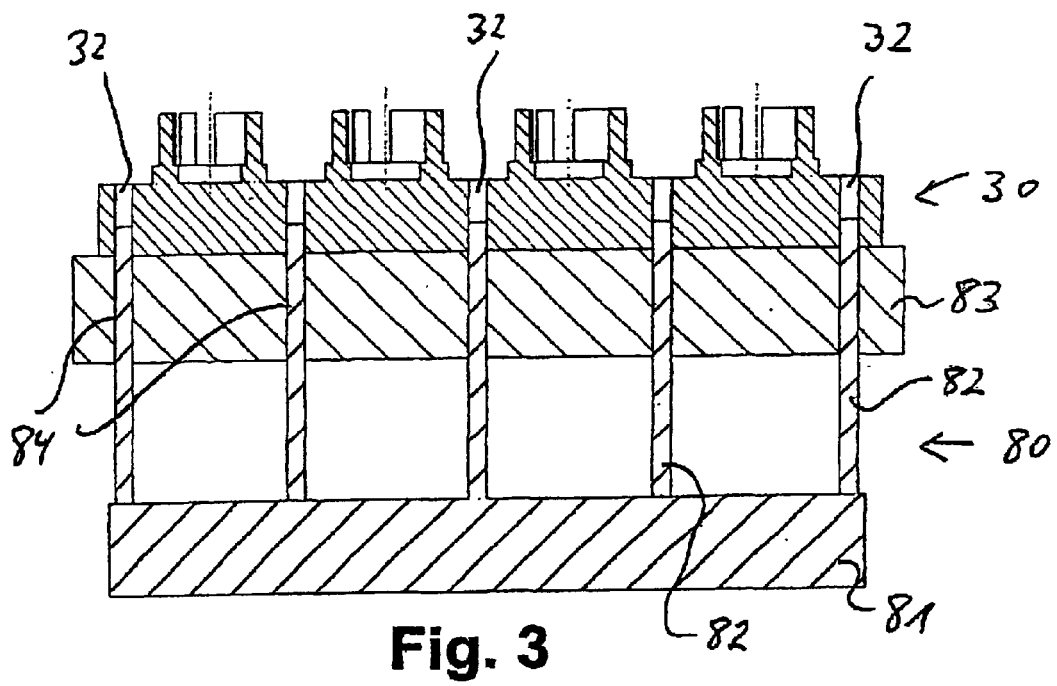

FIG. 3 shows the lower part 80 of an assembly device with a base plate 81 and assembly pins 82 arranged thereon. Furthermore, an assembly plate 83 is provided on which the first base plate cassette 30, which assumes the function of the basic cassette, is arranged. Assembly plate 83 can be arranged so as to be movable in vertical direction relative to assembly pins 82. It is also possible, however, to make assembly plate 83 fixed and the base plate with assembly pins 82 displaceable in vertical direction. The assembly pins 82 engage in the positioning holes 32 of the first base plate cassette 30.

Figure 4:
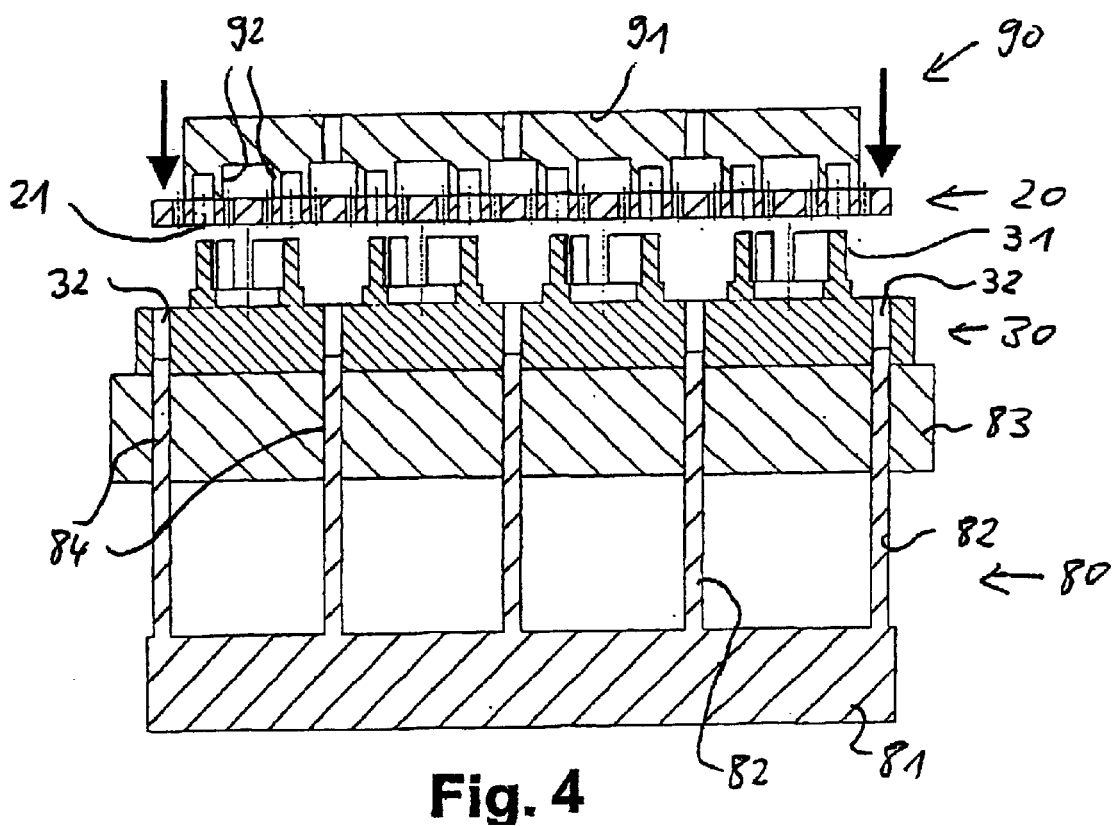

As shown in FIG. 4, the second foil cassette 20 is lowered from the top by means of upper part 90 of the assembly device. Upper part 90 comprises a base plate 91 and bottom-side ejector elements 92, which engage and hold gears 21. The dimensions of the ejector elements are adapted to the size of gears 21. Foil cassette 20 is positioned above the first base plate cassette 30 in such a way that gears 21 are located above the associated shafts of lower web parts 31.

Figure 5:
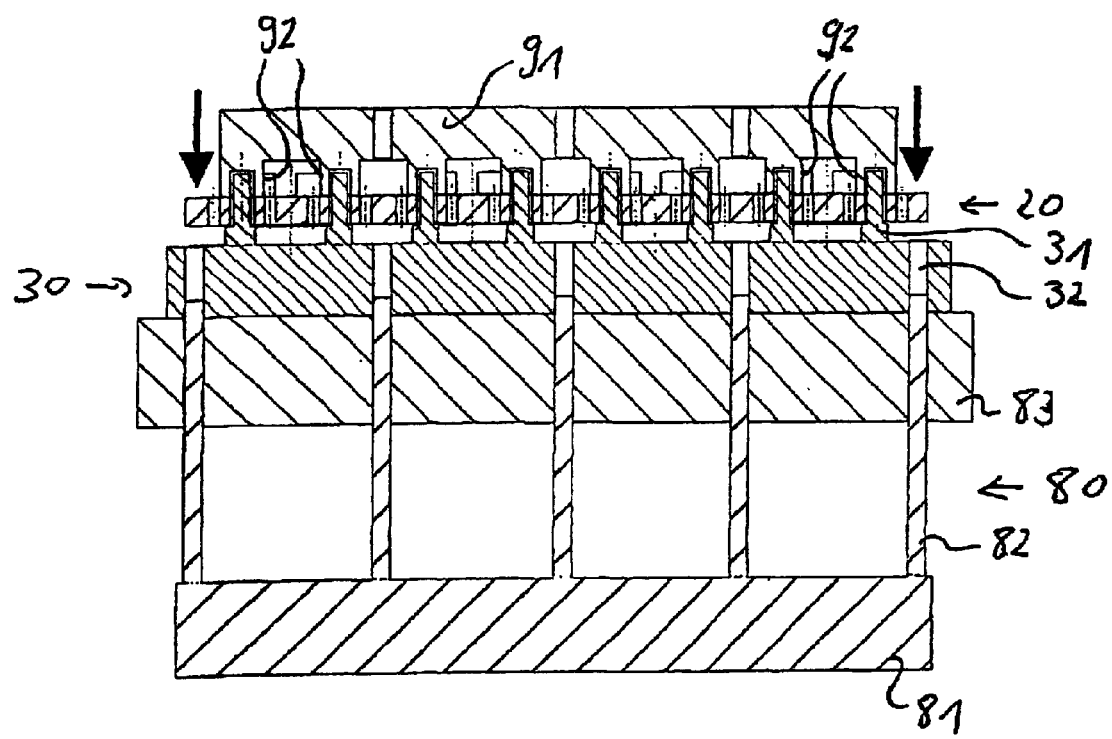

Subsequently, the upper part 90 is lowered as depicted in FIG. 5, such that gears 21 located in the cassette system are pushed onto shafts 35 of lower web parts 31.

Figure 6:
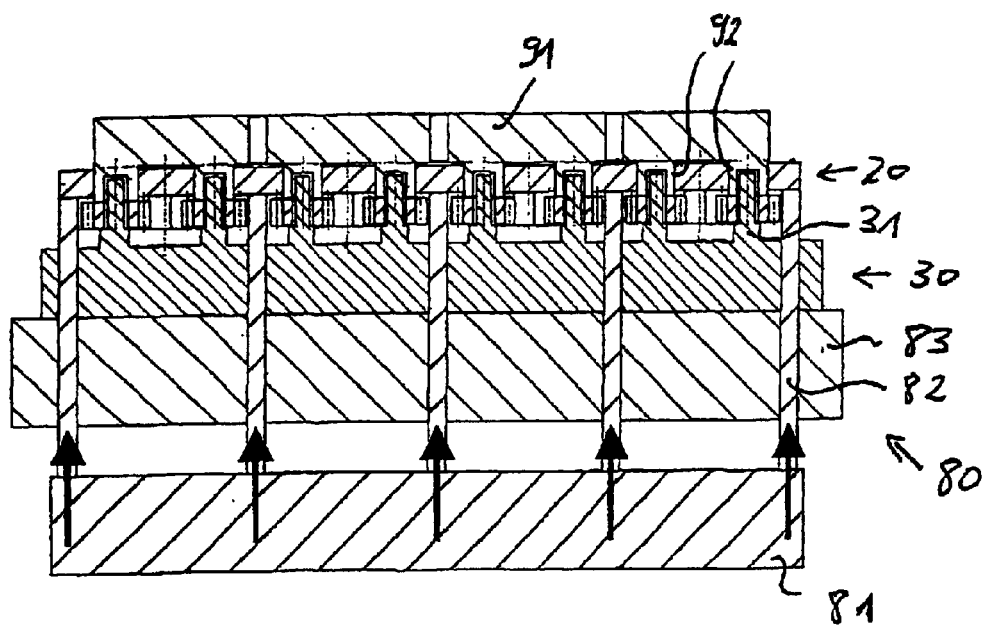
Figure 7:
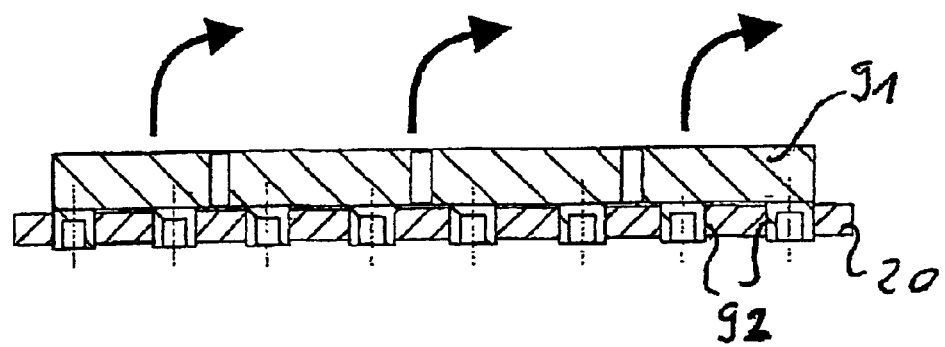

After this assembly process has been completed, assembly pins 82 are pushed upwardly as shown in FIG. 6, which causes the component carrier of foil cassette 20 to be separated from gears 21. By means of base plate 91, the component carrier of foil cassette 20, which is released from gears 21, is removed as shown in FIG. 7. These preassembled subassemblies, comprising lower web parts 31 and planetary gears 21 are completed according to the process steps illustrated in FIGS. 16–21 to form a web subassembly of a planetary gear unit and according to FIGS. 33–36 and FIGS. 37–40 to form a planetary gear unit.

Figure 8:
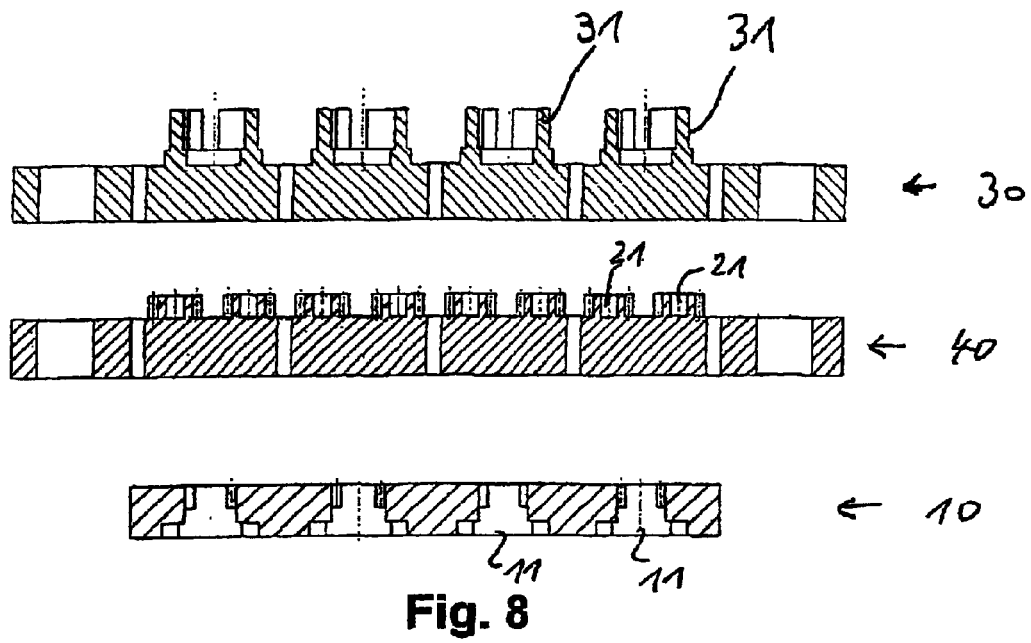
FIGS. 8–15 illustrate the process steps for the preassembly of a microgear unit according to a second embodiment.

FIG. 8 shows cassettes 10, 30, 40 according to a further embodiment. The upper web parts 11 are again arranged in a first foil cassette 10 and the lower web parts in a first base plate cassette 30. In contrast to FIG. 1, microcomponents 21, i.e. gears 21, are arranged on a second base plate cassette 40. The use of two base plate cassettes and one foil cassette subsequently calls for different assembly steps.

Figure 9:
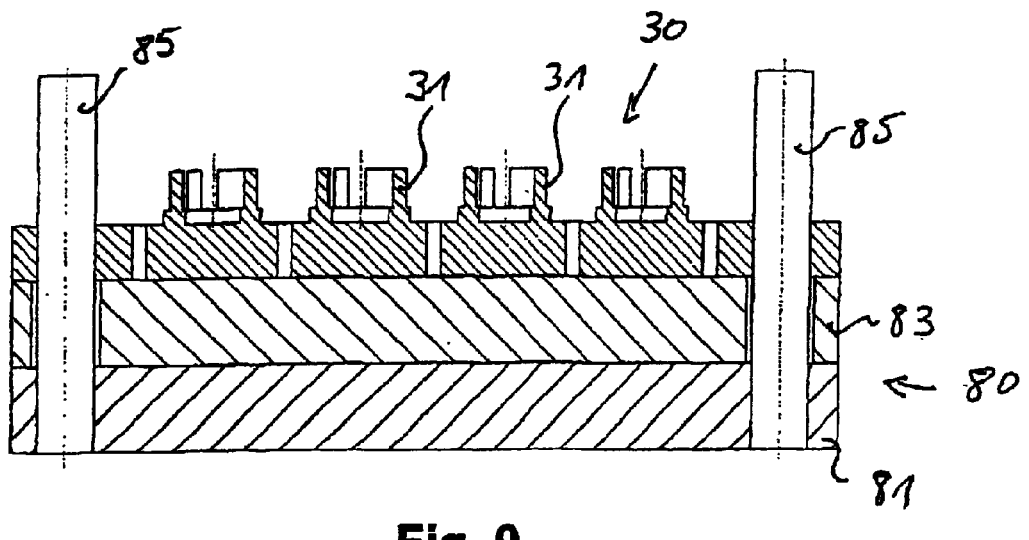

FIG. 9 shows how the first base plate cassette 30 is positioned on assembly plate 83 of the bottom part of assembly machine 80. Two assembly pins 85 are arranged in base plate 81. In the embodiment shown these assembly pins clearly protrude upwardly relative to the first base plate cassette 30.

Figure 10:
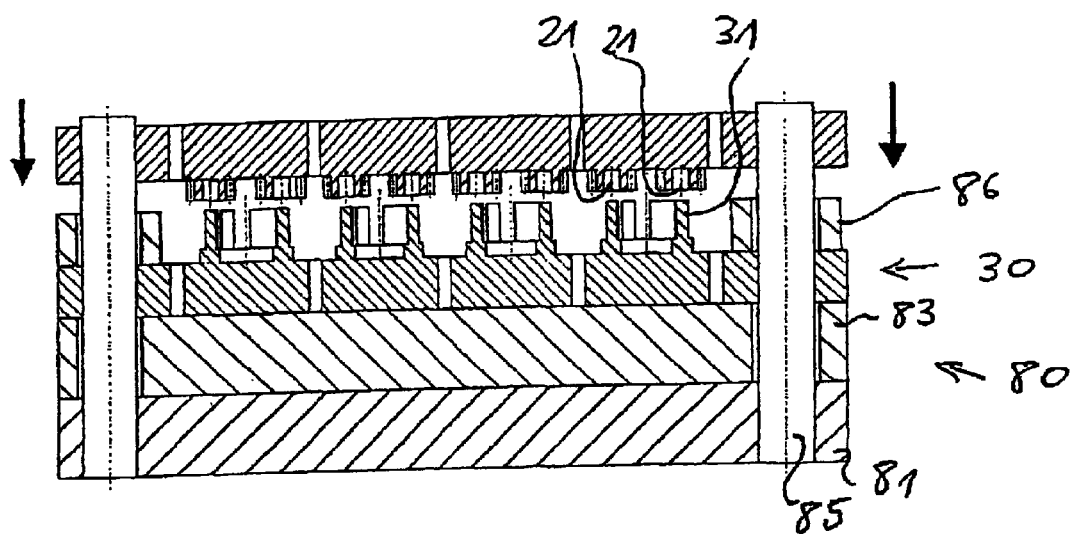

The second base plate cassette 40—as shown in FIG. 10—is lowered from the top with microcomponents 21 pointing in downward direction. Positioning pins 85 also position the second base plate cassette 40.

Figure 11:
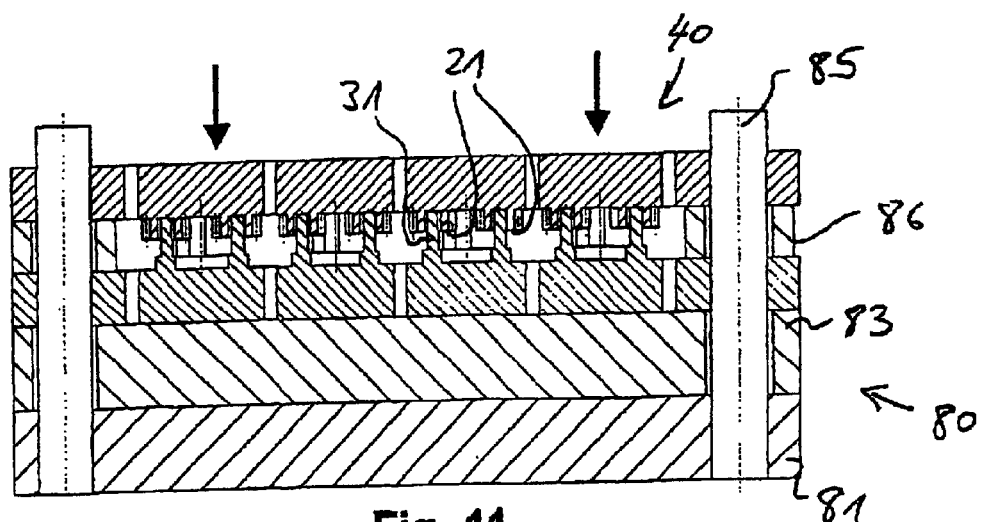

The second base plate cassette 40 is subsequently pressed onto the first base plate cassette 30—as shown in FIG. 11—which causes the gears 21 to be pushed onto the shafts 35 of the lower web parts 31.

Figure 12:
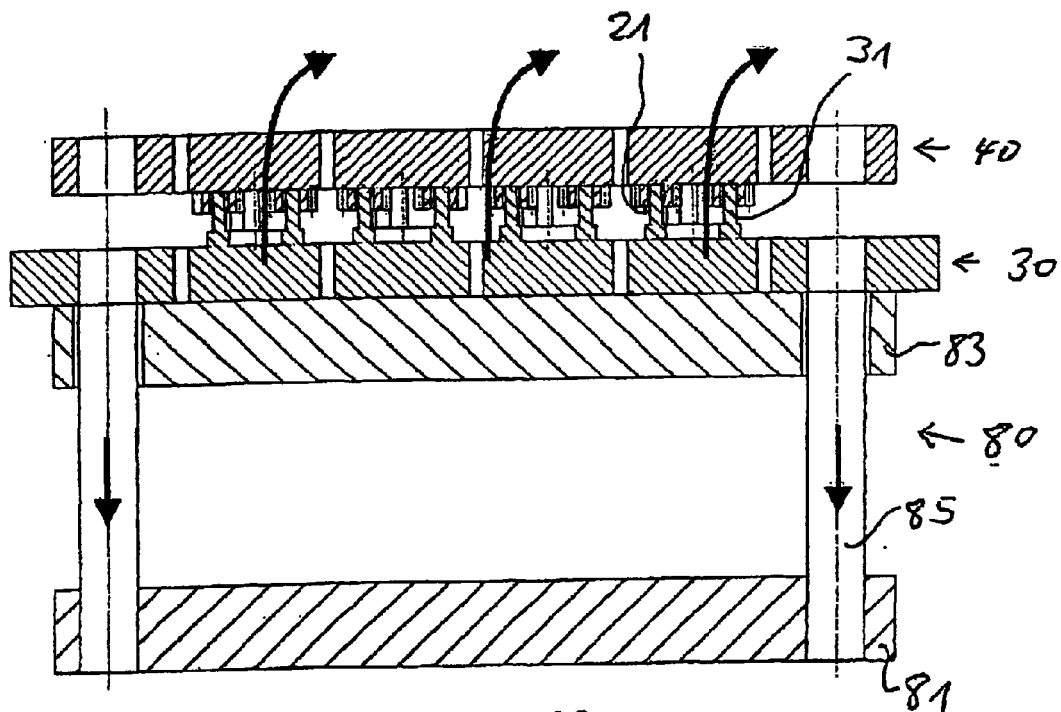

Thereafter, base plate 81 with assembly pins 85 is lowered in downward direction such that base plate cassettes 30 and 40 are released from assembly pins 85 (see FIG. 12).

Figure 13:
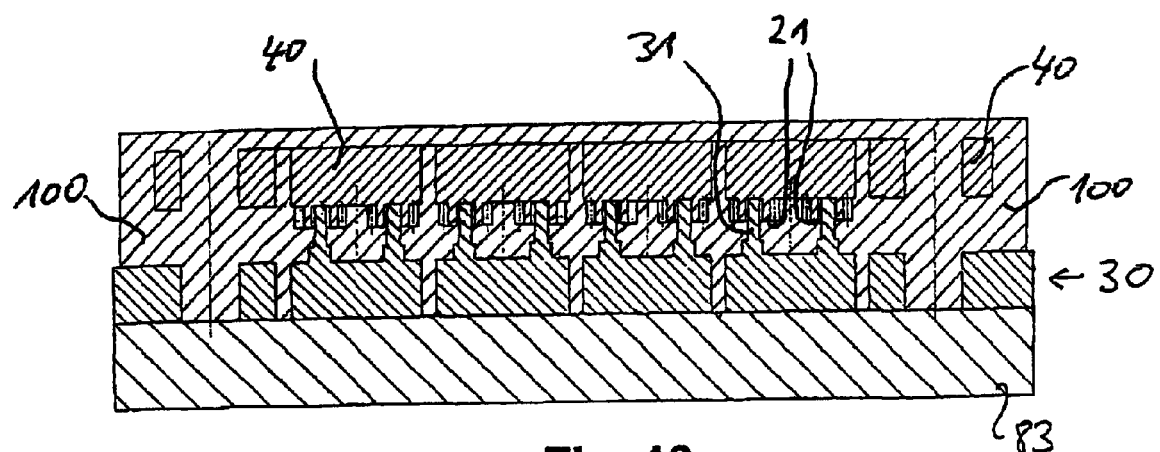
Figure 14:
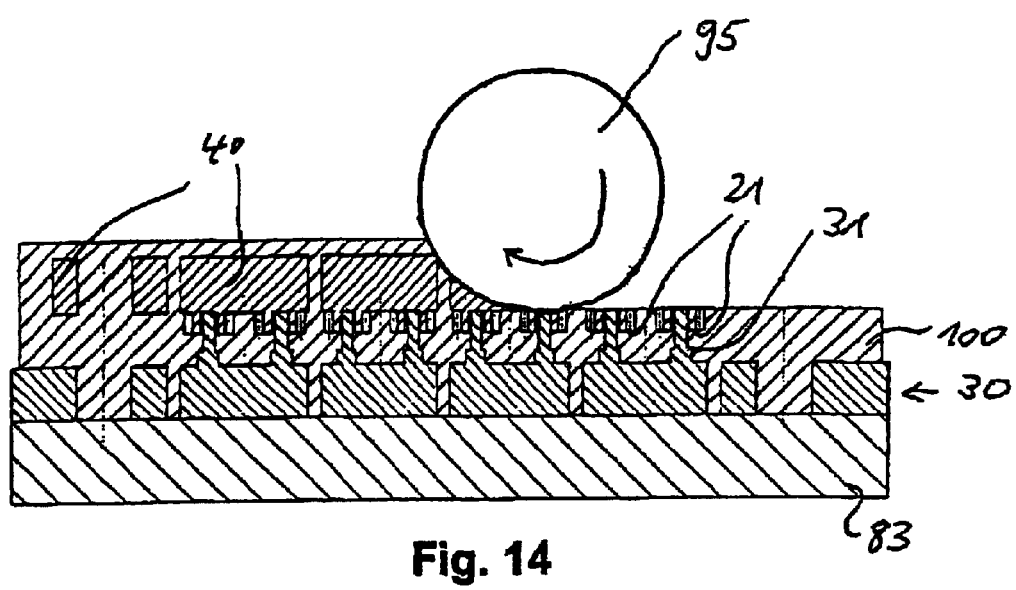
Figure 15:
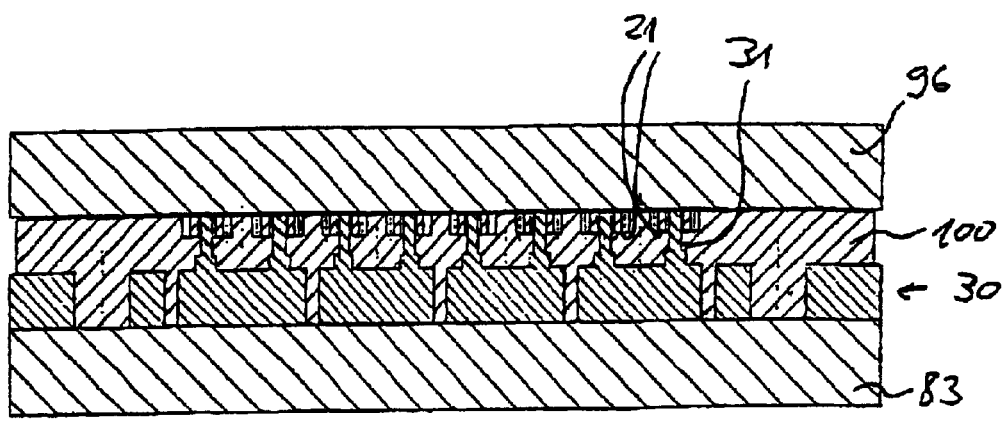

In a further step, which is shown in FIG. 13, the two cassettes 30 and 40 are embedded in a fixation compound 100. This embedding is required so that base plate 40 of the base plate cassette can be removed in a further step, as illustrated in FIG. 14. This is done mechanically by means of a milling unit 95. Subsequently, a fixation plate 96 is added as indicated in FIG. 15.

Figure 16:
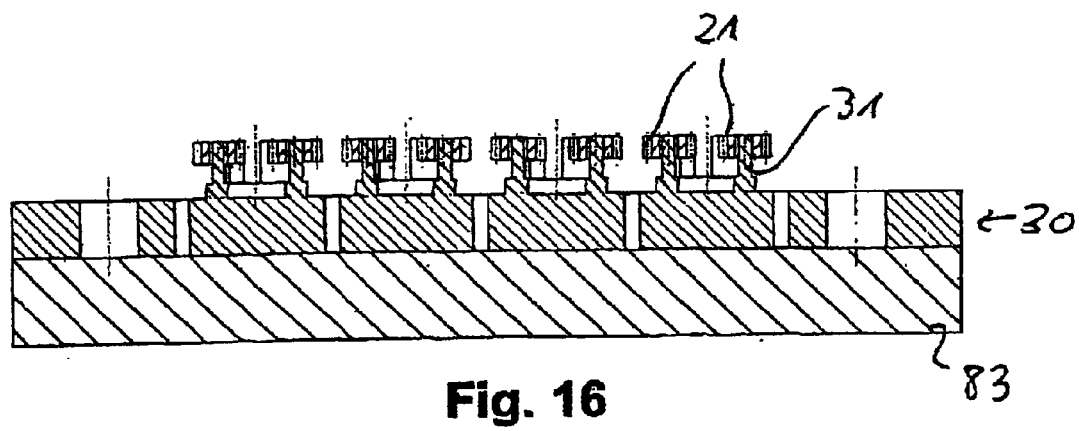
FIGS. 16–21 illustrate the process steps for the final assembly of a preassembled microgear unit according to FIGS. 1–7 or 8–15, FIGS. 22–29 show the process steps until separation or cassette loading of the microgear units.

After these preassembly steps have been completed, the final assembly takes place, i.e. the assembly of the upper web parts 11, which are still located in the first foil cassette 10. Based on FIG. 6 or based on FIG. 15 and the removal of fixation compound 100, the arrangement depicted in FIG. 16 is obtained, comprising base plate cassette 30 with lower web parts 31 and the previously assembled gears 21.

Figure 17:
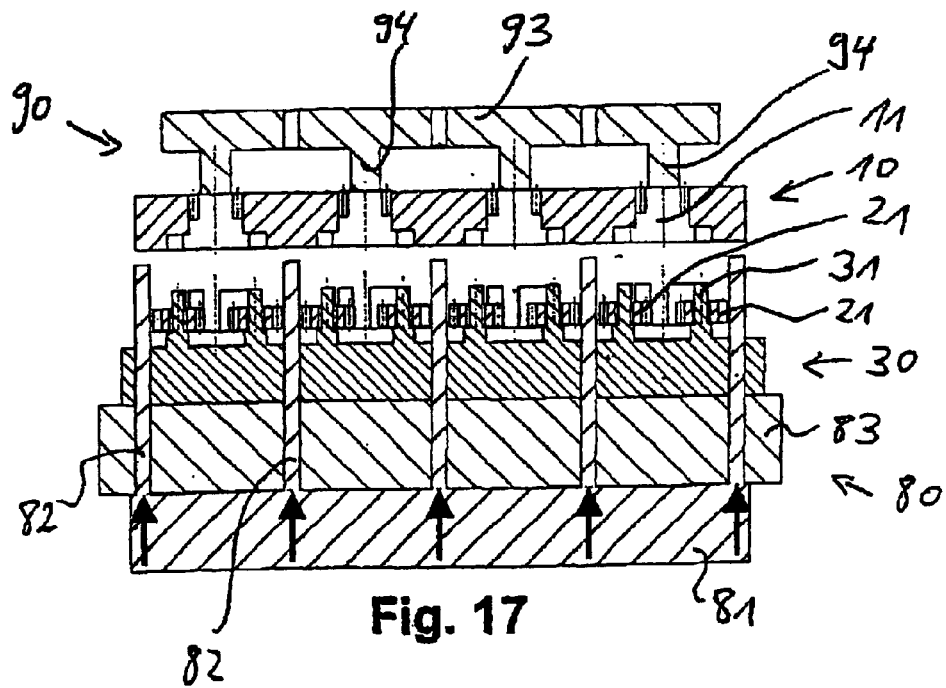

Base plate cassette 30 is positioned according to FIG. 17 in the lower part 80 of the assembly device on assembly plate 83 and is fixed by means of assembly pins 82. The first foil cassette 10 is lowered from above by means of upper part 90 of the assembly device, and is positioned over base plate cassette 30. This upper part 90 comprises a base plate 93 with ejector elements 94 arranged on the bottom side.

Figure 18:
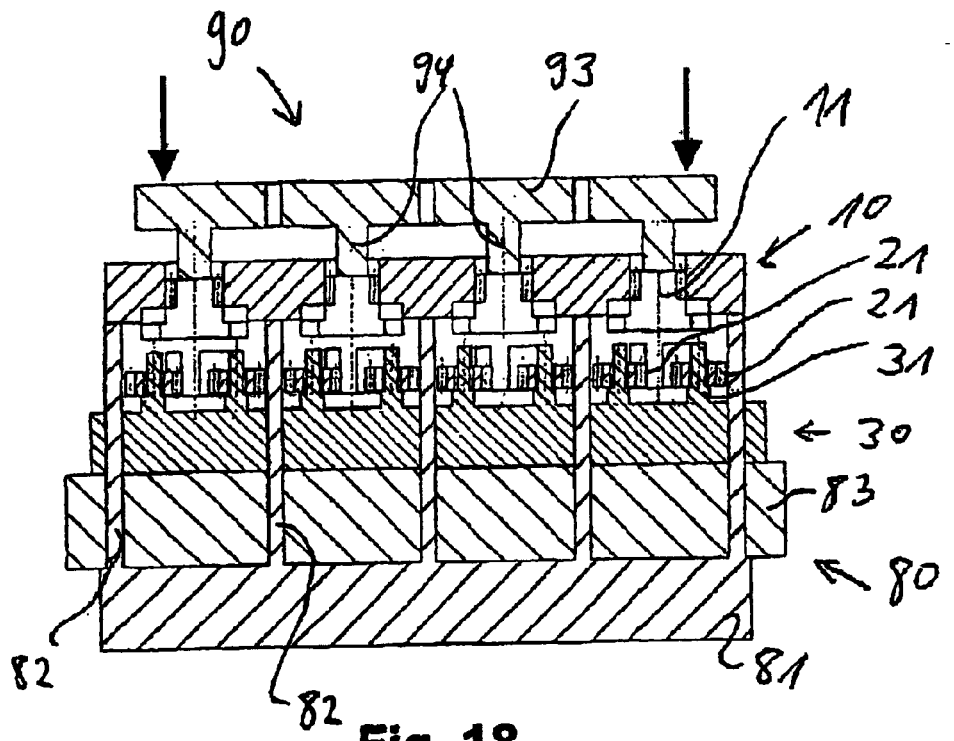
Figure 19:
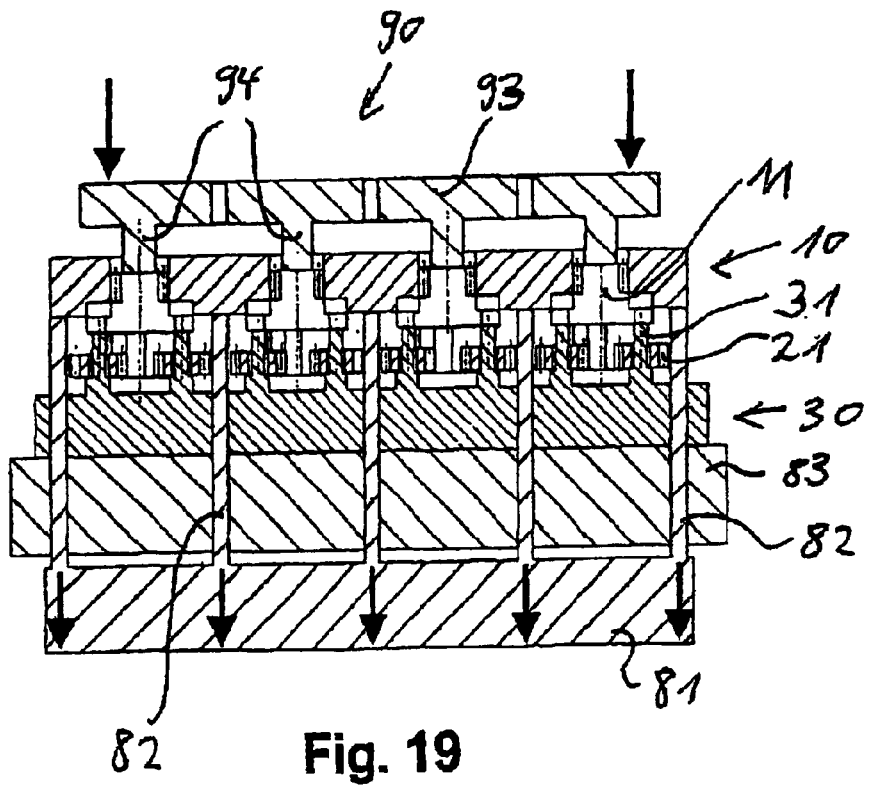

Foil cassette 10 is lowered far enough until it rests on assembly pins 82 (see FIG. 18). Subsequently, base plate 93 is lowered further, such that ejector elements 94 partially detach the upper web parts 11 located in the cassette system from the component carrier of foil cassette 10. As shown in FIG. 19, microcomponents 11, which are still located in the cassette system, are lowered together with foil cassette 20 until the microcomponents are completely assembled. This process is illustrated in FIGS. 18–20.

Figure 20:
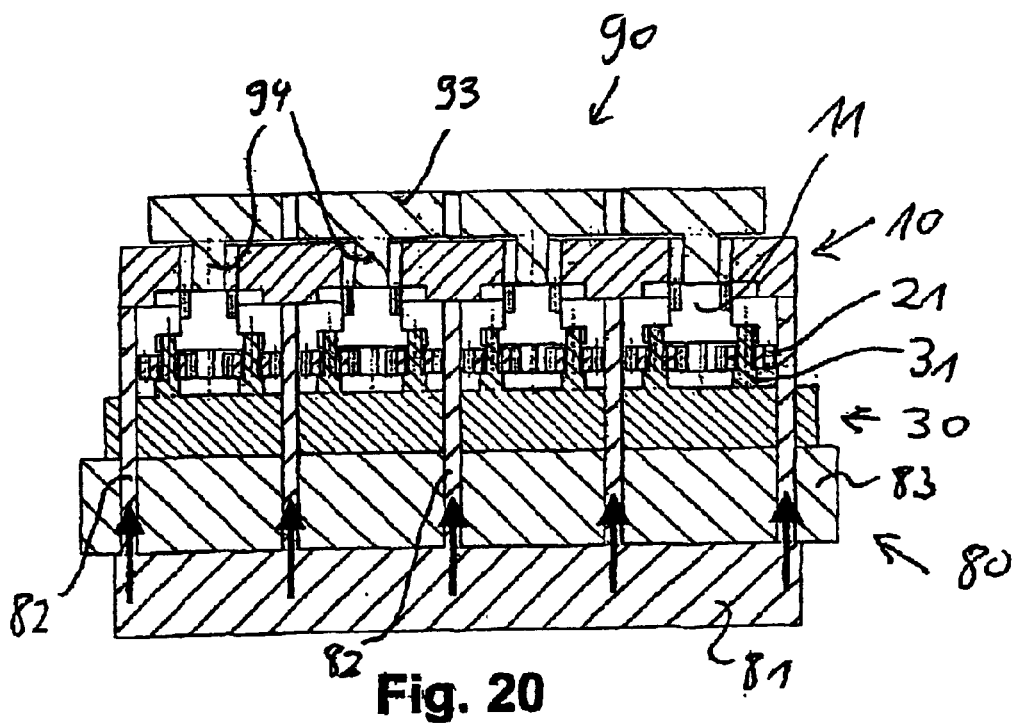
Figure 21:
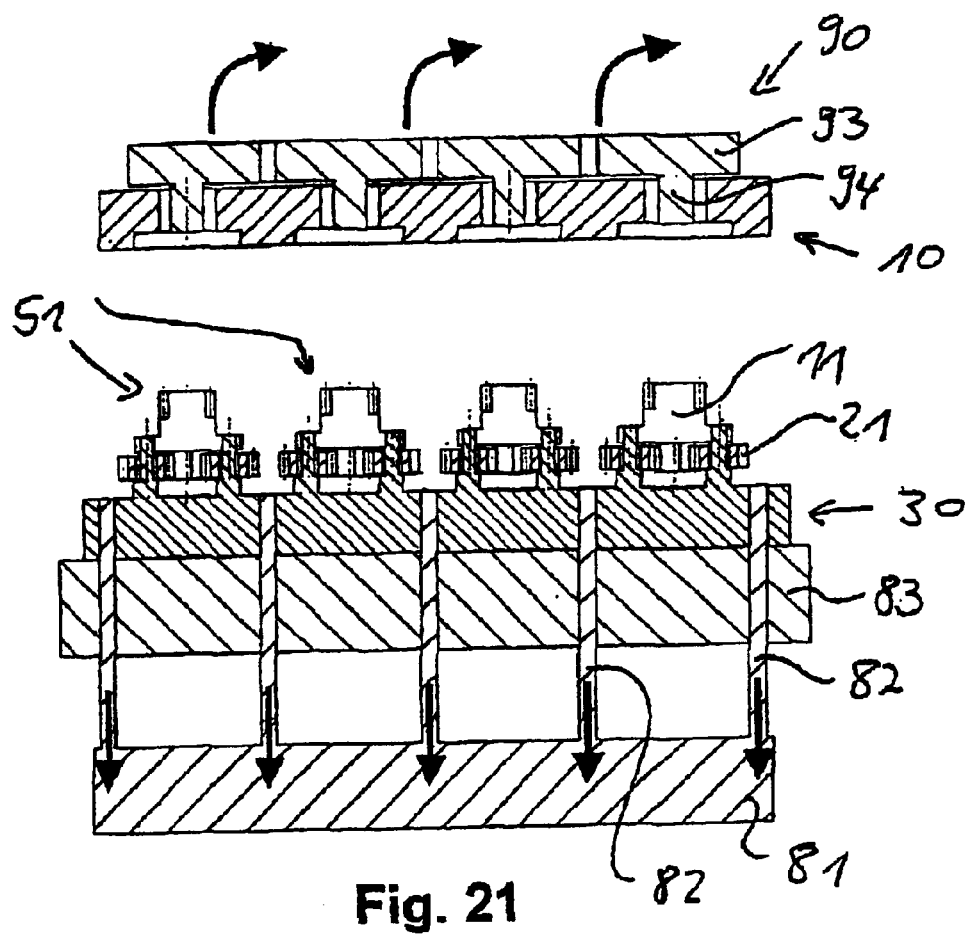

After the upper web parts 11 have been mounted, the component carrier of foil cassette 10 is pushed upwardly by means of assembly pins 82 and is detached from the upper web parts 11 and removed by means of upper part 90 of the assembly device (see FIG. 20). At the same time, assembly pins 82 are moved downwardly far enough so that they still fix base plate cassette 30 (FIG. 21).

Figure 22:
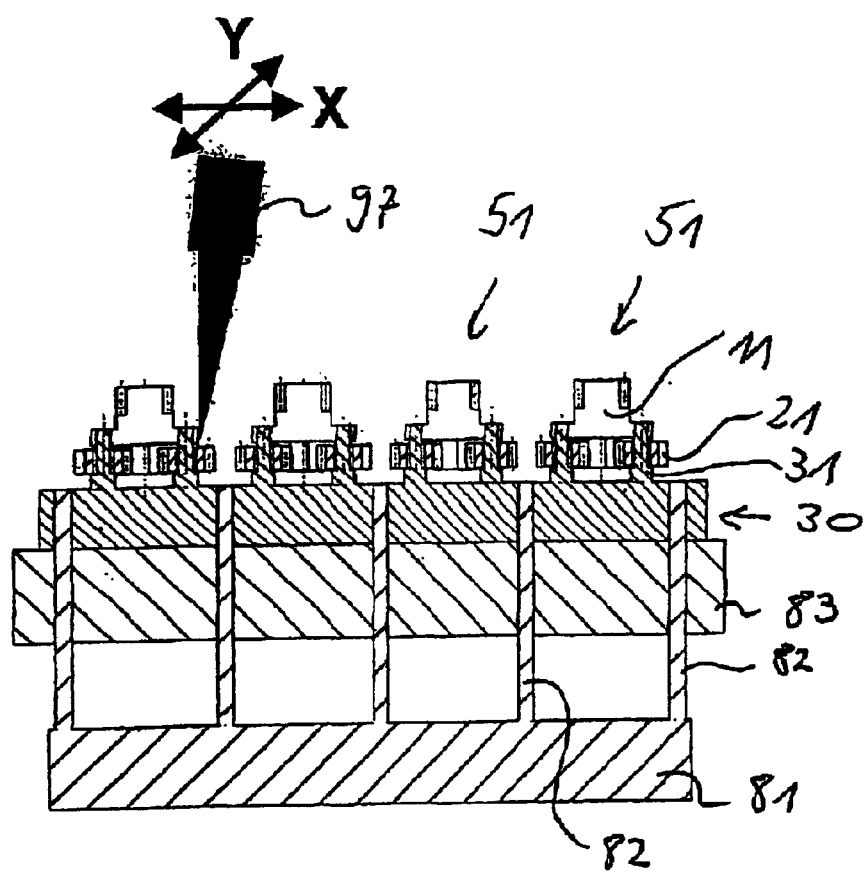
Figure 23:
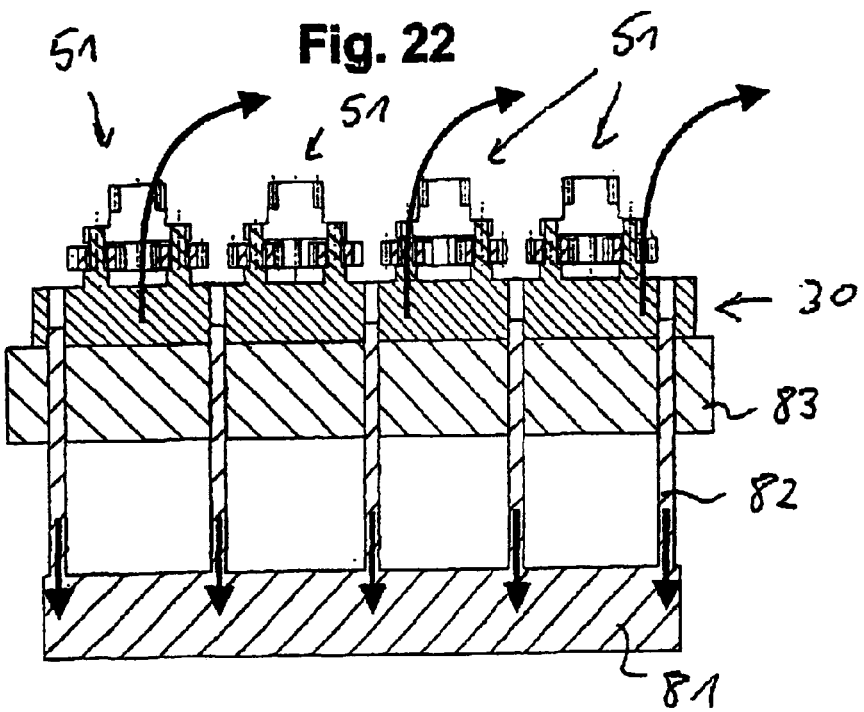

In FIG. 22, the upper web part 11 and the lower web part 31 are connected, e.g. by welding, to complete component units 51, i.e. the microgear units. Thereafter, base plate cassette 30 is removed from assembly plate 83 (see FIG. 23).

The advantages of the two assembly concepts will now be compared. Assembly concept I is illustrated in FIGS. 1–7 and FIGS. 16–21 whereas assembly concept II is shown in FIGS. 8–15 and FIGS. 16–21.

In assembly concept I (Table 1) only the planetary gears and the upper web parts are fixed in foil cassettes, whereas the lower web parts are used in the form of base plate cassettes. The lower web parts no longer need to be ejected from a foil cassette and intermediately stored prior to assembly, so that no receiving device is required. In addition, with the reduced number of foil cassettes, the number of part-specific ejection tool sets is reduced to two.

Only the planetary gear cores must be removed prior to assembly. After the two assembly steps, executed one directly after the other, and the welding step, the sprue plate of the lower web parts is removed by the process steps "embedding in wax (fixation compound)," "mechanical processing," and "cleaning."

Consequently, one of the five surfaces is processed only after assembly, i.e. the strict sequence "first mechanical processing, then assembly" no longer applies. It is advantageous that only five surfaces have to be mechanically processed.

In assembly concept II (Table 2) only the upper web parts are fixed in the foil cassettes. This reduces the number of surfaces to be mechanically processed to a total of four, so that the time for mechanical processing is further reduced. After assembly of the planetary gears with the lower web parts, this system is embedded, for instance, in wax, the sprue plate or base plate of the planetary gears is mechanically removed, and the fixation compound is removed ("cleaning"). During subsequent assembly of the upper web parts, these parts are pushed out of the foil cassette. Only a single set of ejection tools is required for this purpose. After the second assembly step, welding is performed and the base plate of the lower web parts is finally removed. Embedding in wax and mechanical removal of the sprue plate is thus performed between and after the two assembly steps.

FIGS. 24–29 show the process steps up to the point where the component units 51 are separated.

Figure 24:
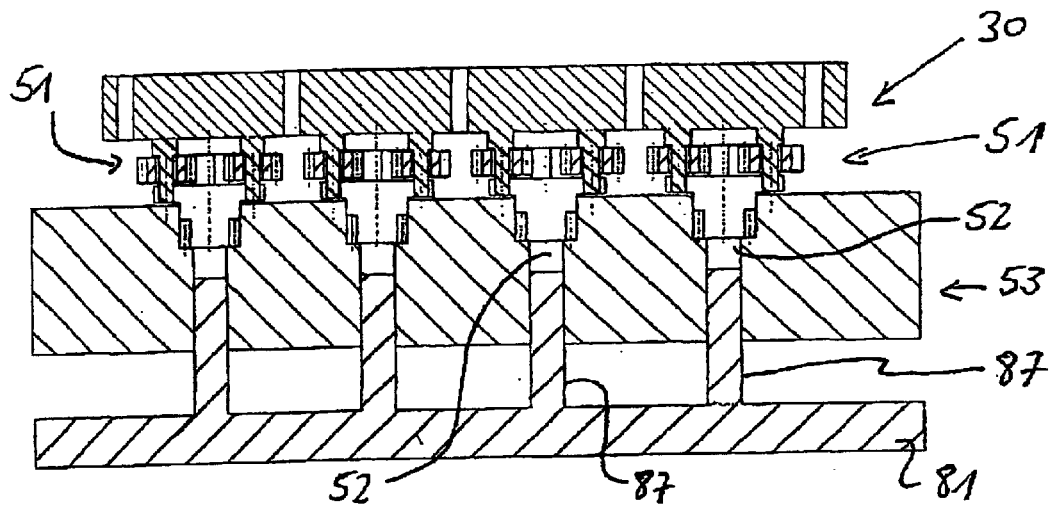
Figure 25:
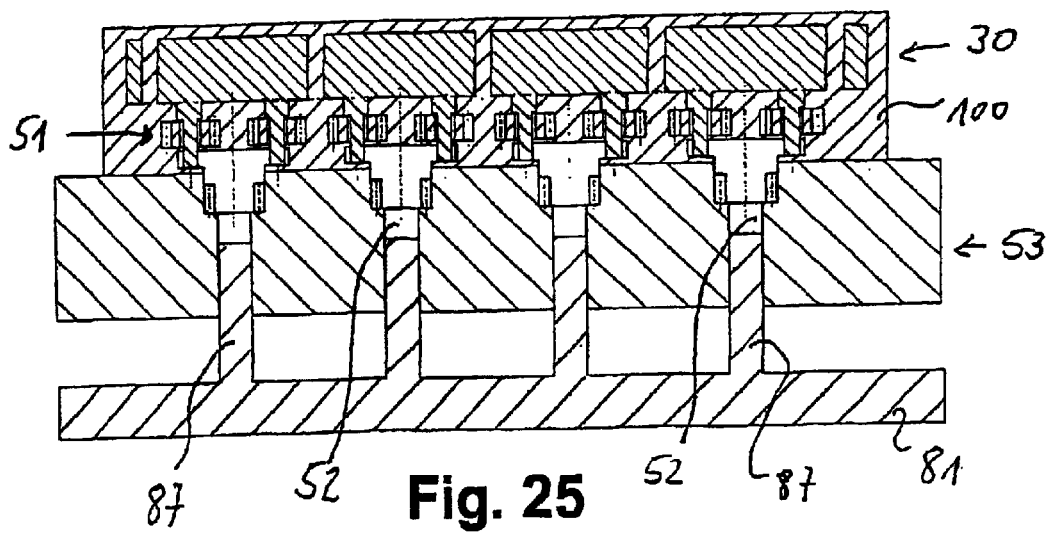
Figure 26:
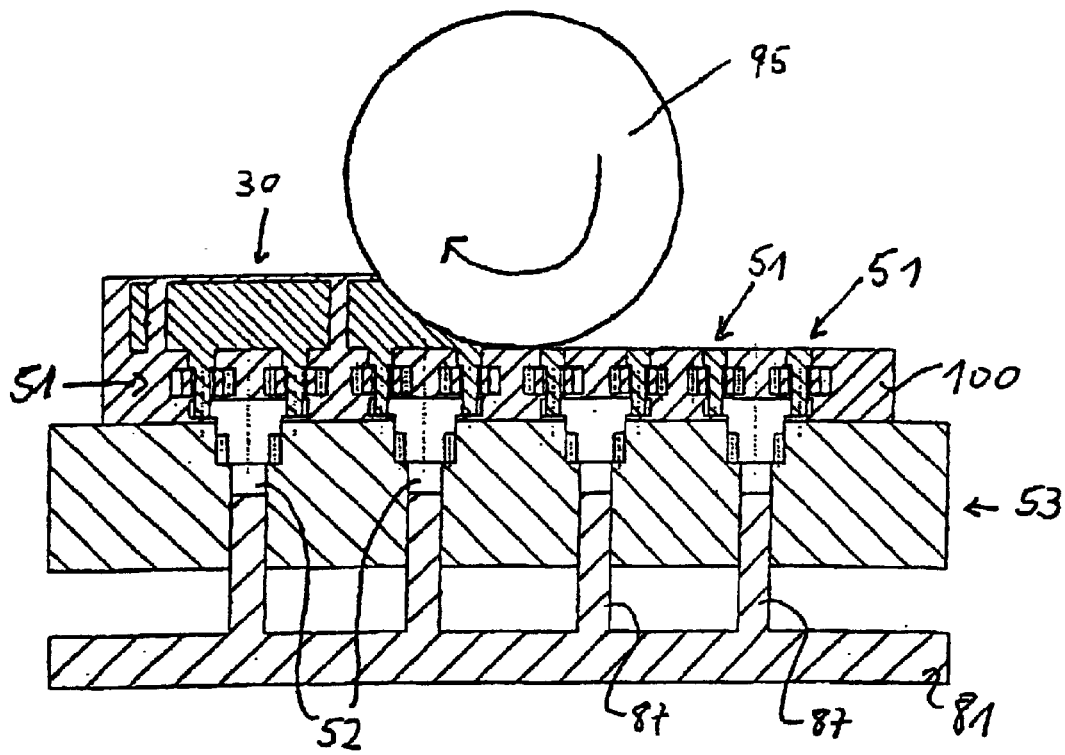
Figure 27:
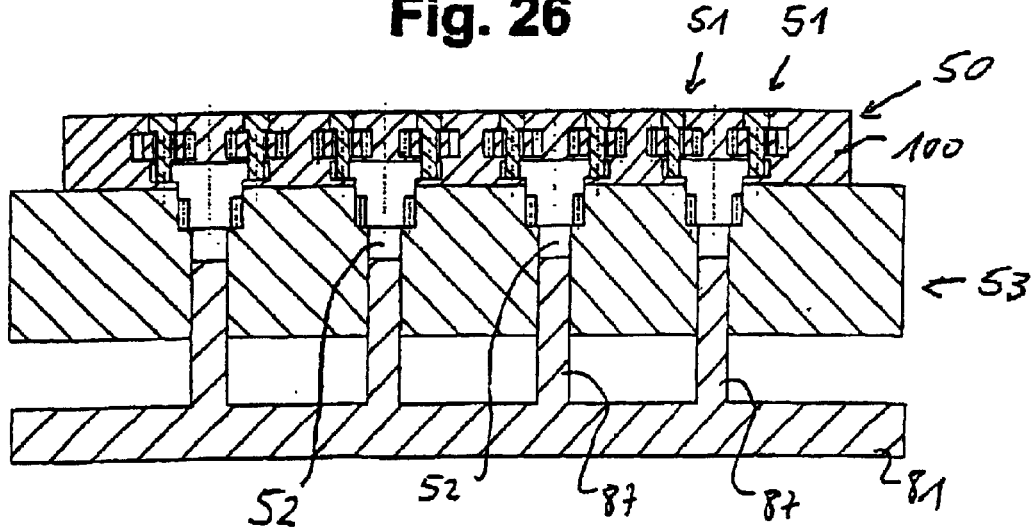
Figure 28:
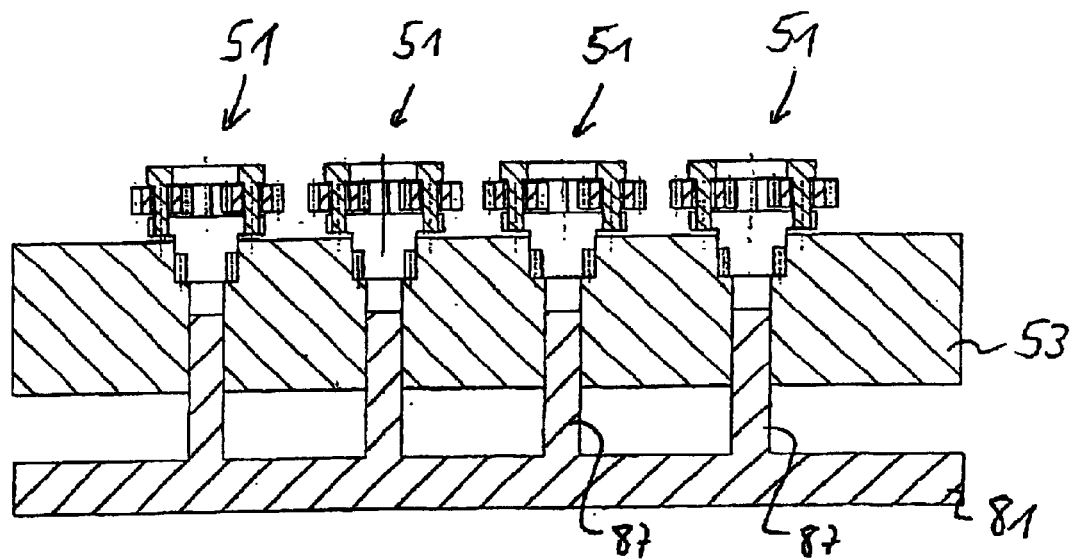
Figure 29:
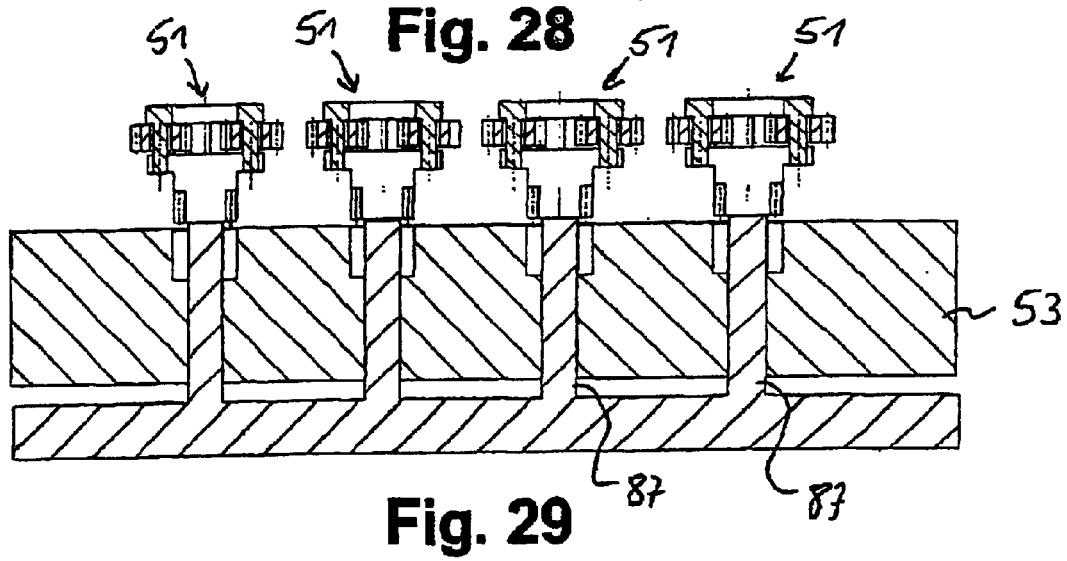

As shown in FIG. 24, base plate cassette 30 is rotated, so that subassemblies 51 point in downward direction. They are inserted in insertion opening 52 of a subassembly holder 53. Subsequently—as shown in FIG. 25—both base plate cassette 30 and subassemblies 51 are embedded by means of fixation compound 100. This step is required in order to remove the base plate of cassette 30 by means of a milling unit 95 in a further step, which is depicted in FIG. 26. Fixation compound 100 can now serve as the subassembly cassette 50 as shown in FIG. 27. It is also possible, however, subsequently to remove fixation compound 100 and to remove subassemblies 51 by means of ejector pins 87 from subassembly holder 53 (see FIG. 29).

Figure 30:
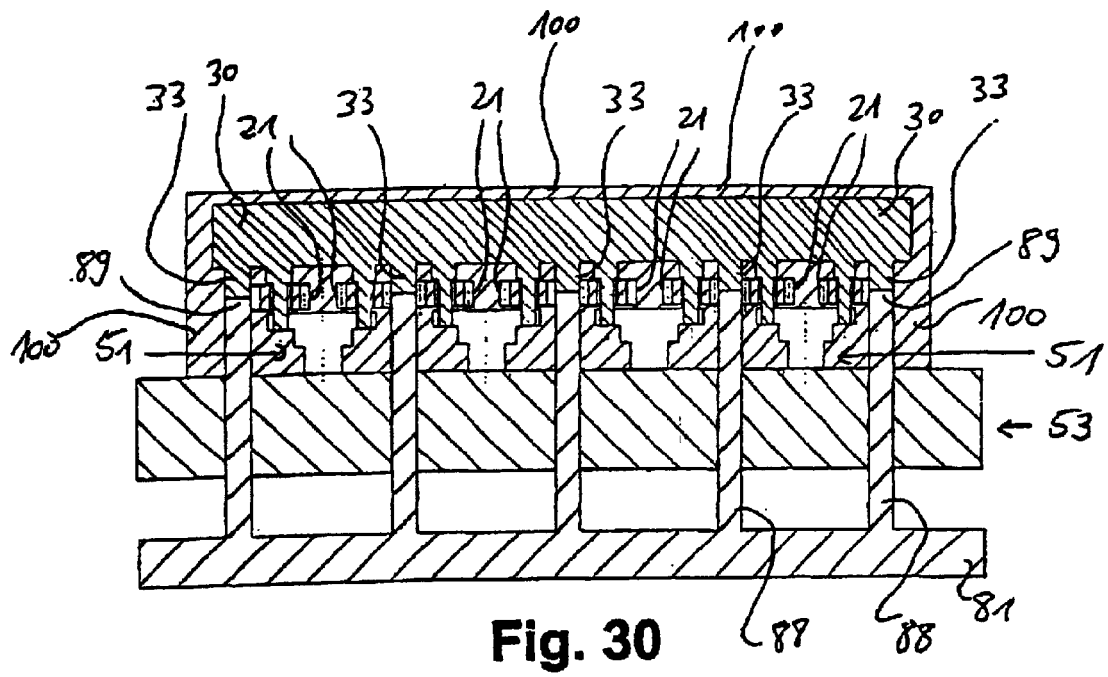
FIGS. 30–32 show the process steps taking into account an anti-rotation device.

A further embodiment is shown in FIG. 30 in which gears 21 are secured against rotation. FIG. 30 is comparable to FIG. 25 except that base plate cassette 30 is additionally provided with fixation pins 33, which are located between subassemblies 51 and have a star shaped contour, such that they can engage in planetary gears 21 and thus secure them against rotation. These fixation pins 33 can be inserts or they can be molded when the base plate cassette and the lower web parts 31 are produced. Base plate 81 is also provided with fixation pins 88, which are likewise star-shaped so that they can engage with gears 21 at their free end 89 to support the anti-rotation securing device.

Figure 31:
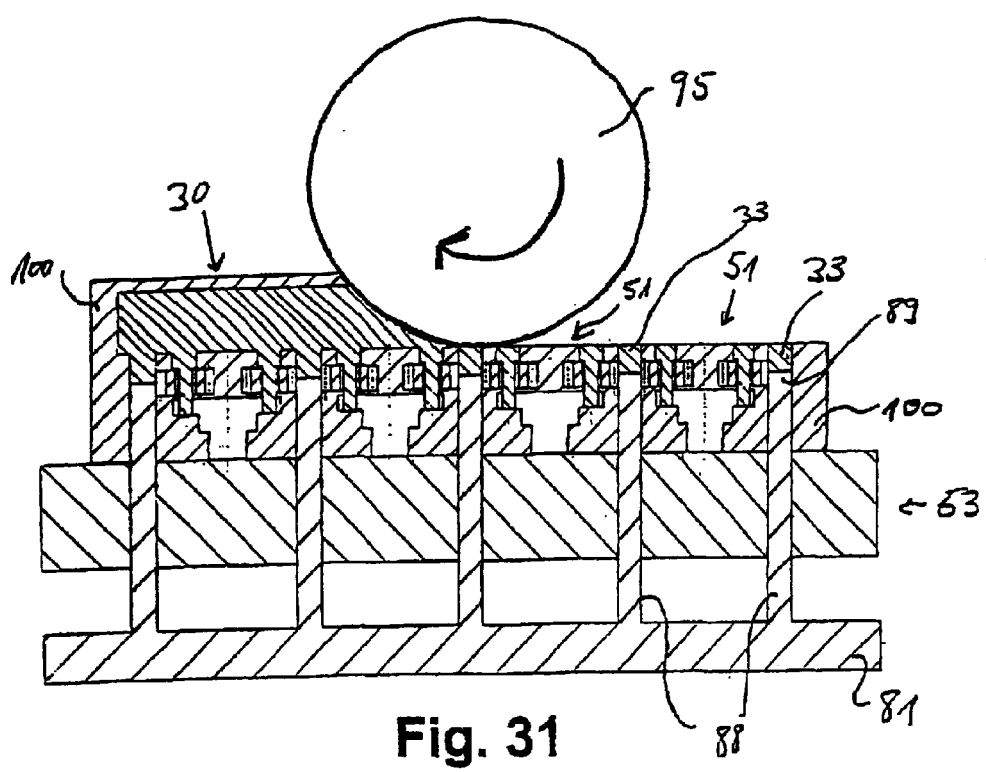
Figure 32:
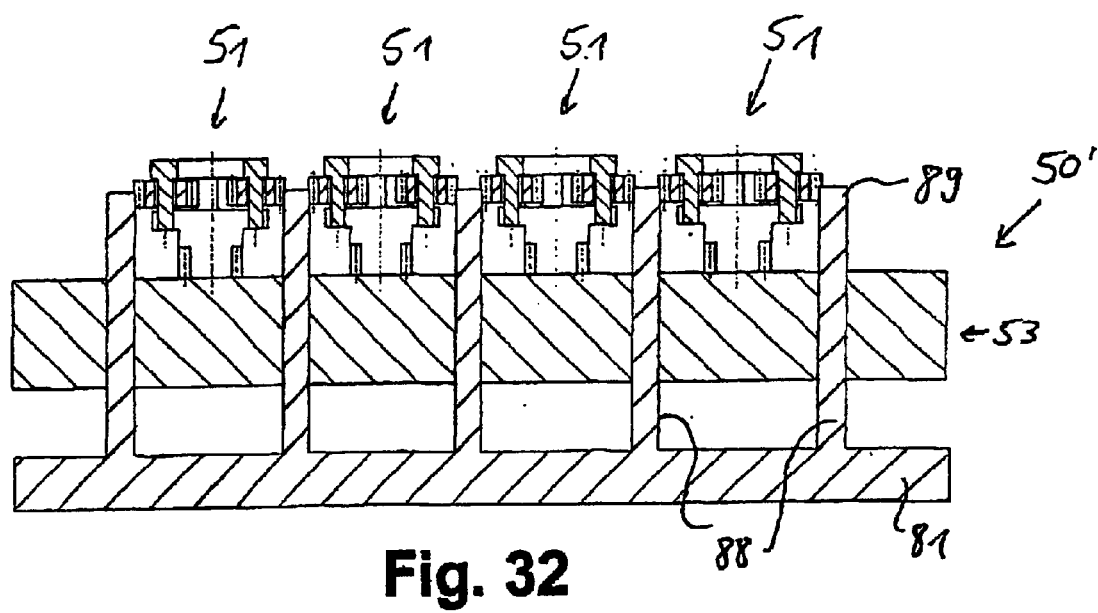

In the process step shown in FIG. 31, after embedding in fixation compound 100, the base plate of cassette 30 is removed by means of a milling unit 95. During this process the remnants of fixation pins 33 fall out of the fixation compound 100 or can be removed by pushing fixation pins 88 upwardly. In a further step, which is depicted in FIG. 32, the fixation compound 100 is removed and base plate 81 with fixation pins 88 and subassemblies 51 arranged thereon thus form an additional cassette, i.e. subassembly cassette 50'.

Figure 33:
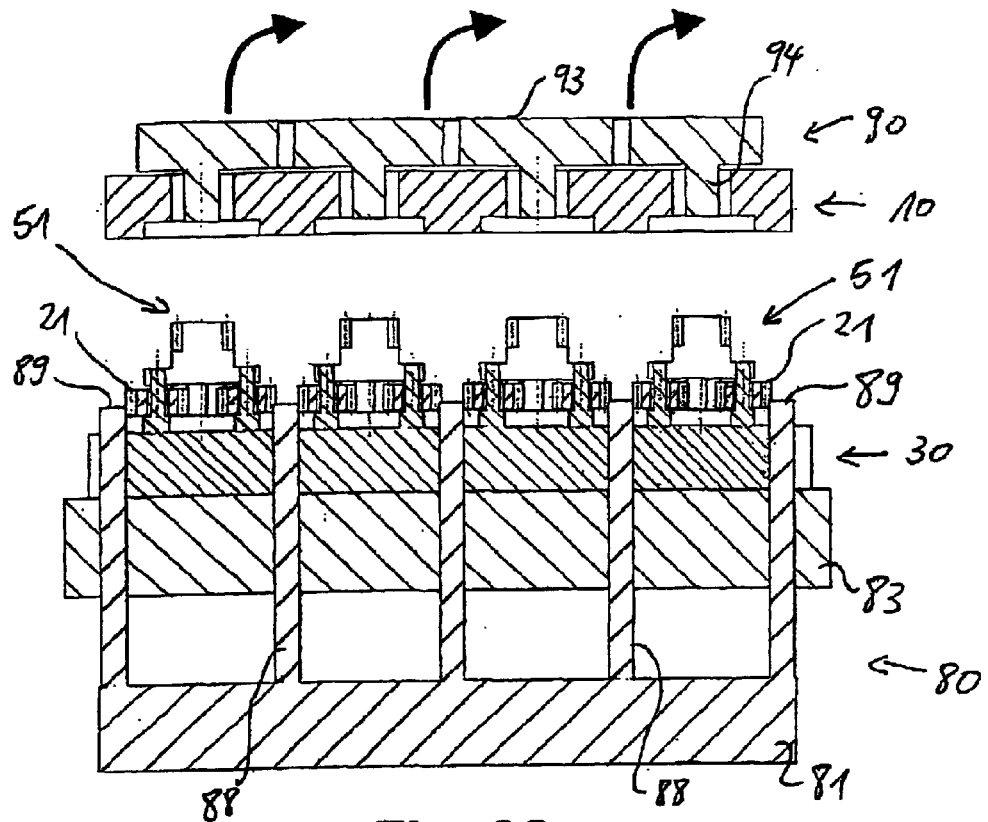
FIGS. 33–36 show the process steps for the assembly of individual gear bushings taking into account an anti-rotation device according to a first embodiment.
Figure 34:
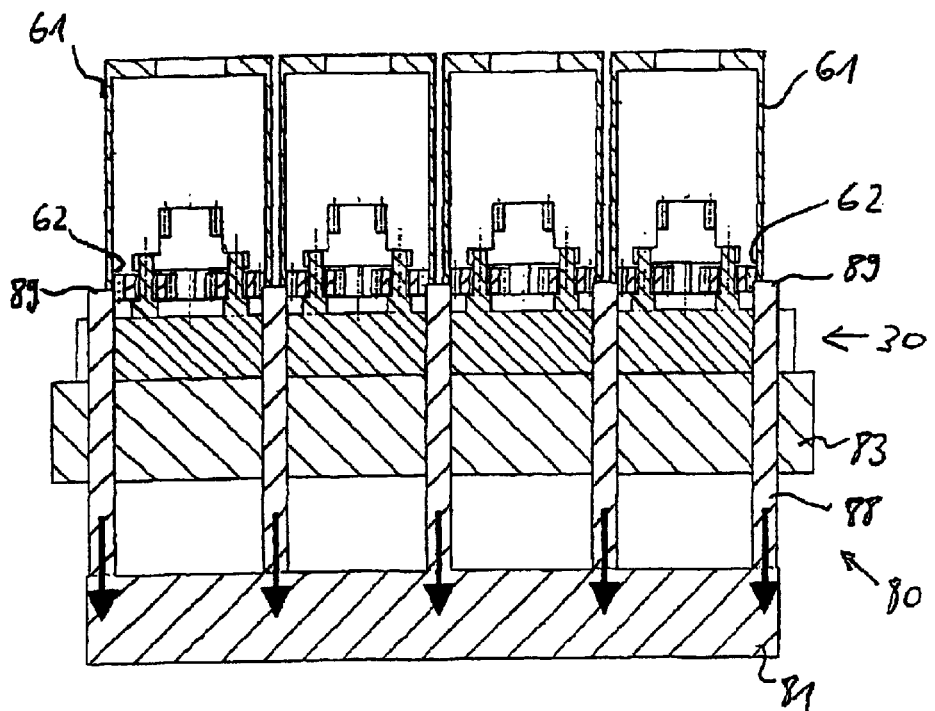
Figure 35:
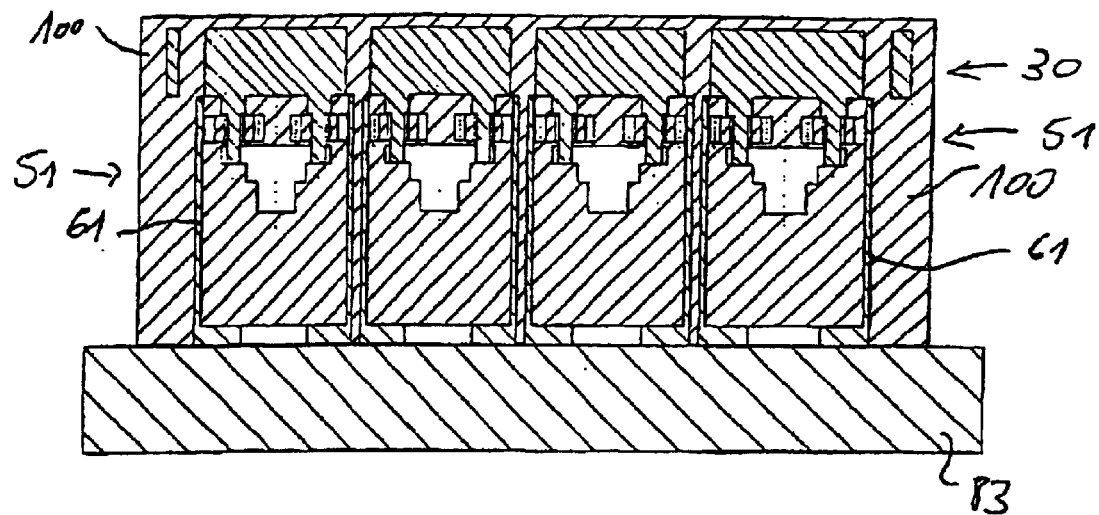
Figure 36:
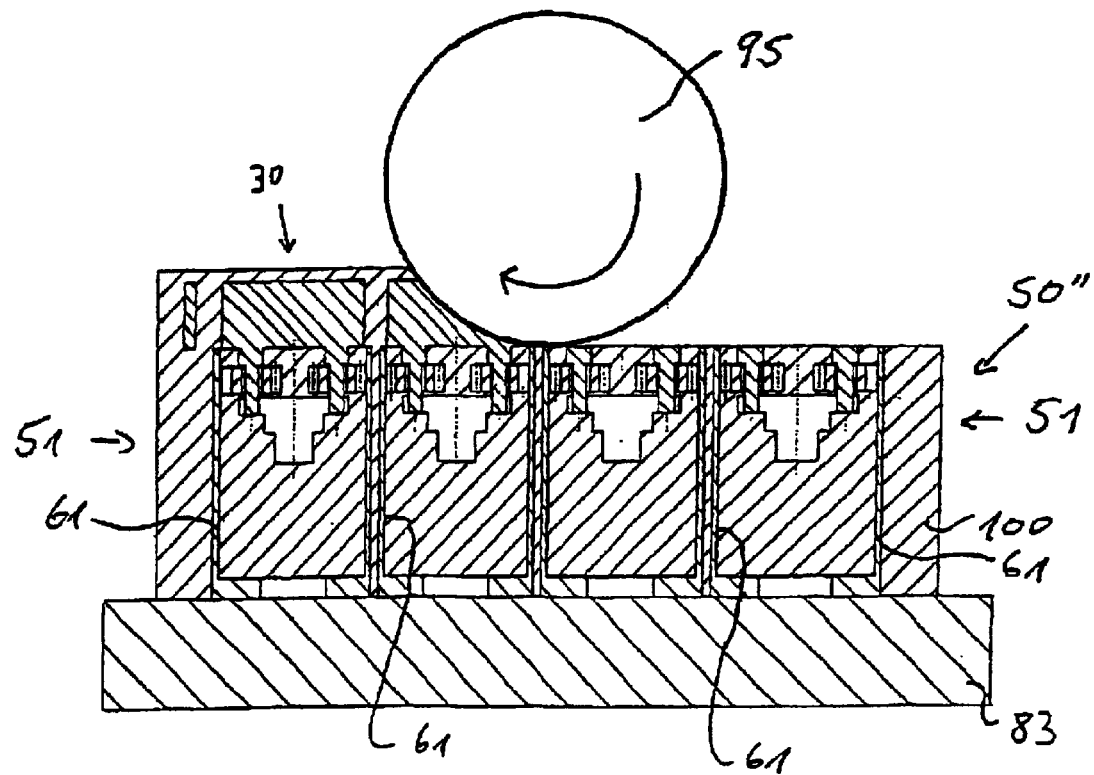
Figure 37:
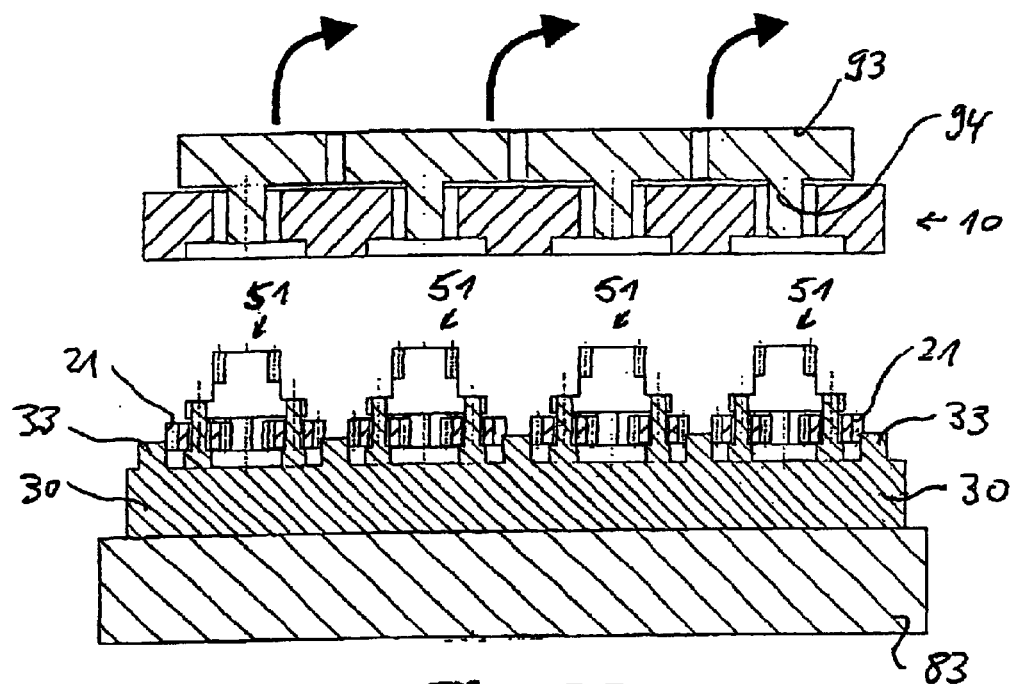
FIGS. 37–40 show the process steps for the assembly of cassette-loaded gear bushings taking into account an anti-rotation device.

FIGS. 33–36 depict a further embodiment in which bushings 61 provided with internal gears 62 are subsequently mounted on subassemblies 51. FIG. 33 corresponds to FIG. 21 except that fixation pins 88 are provided with fixation structures at their free ends 89 and engage with the teeth of gears 21 and thus secure the gears against rotation. This makes it possible to fix gears 21 in a predefined position such that bushings 61 can be mounted without problems in a further process step shown in FIG. 34. To this end, pins 88 do not cover the full width of gears 21, such that bushings 61 can be mounted from the top and fixation pins 88 can be lowered. After the assembly of bushings 61 has been completed, a fixation compound 100 is used for embedding, making it possible to remove the base plate of cassette 30 by milling unit 95, as shown in the step of FIG. 36. Fixation compound 100 thus forms an additional foil cassette, i.e. subassembly cassette 50".

Figure 38:
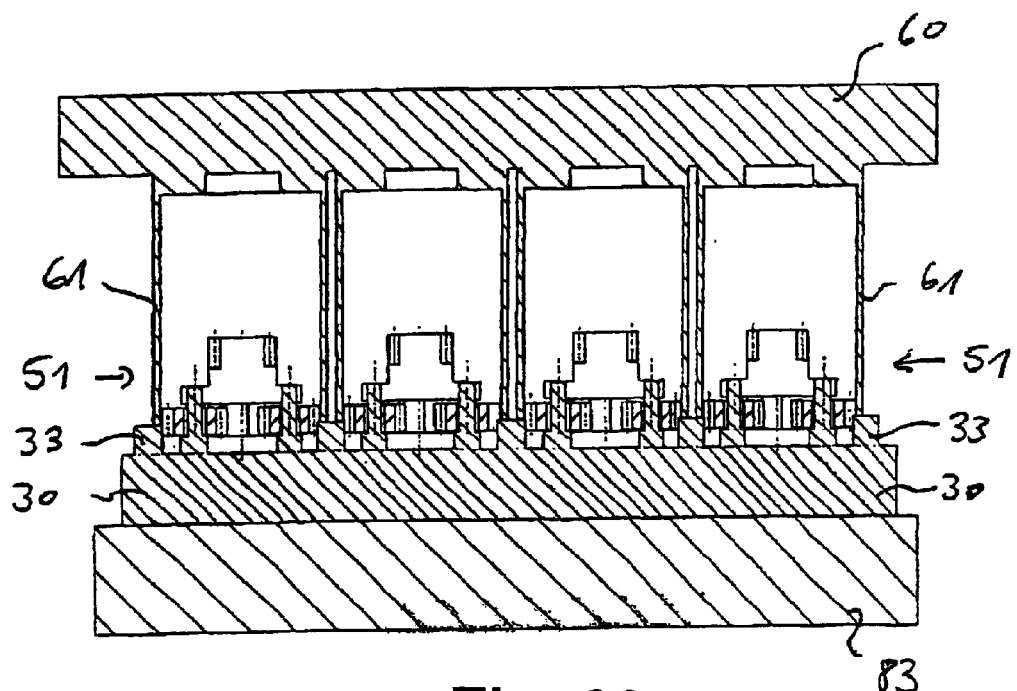
Figure 39:
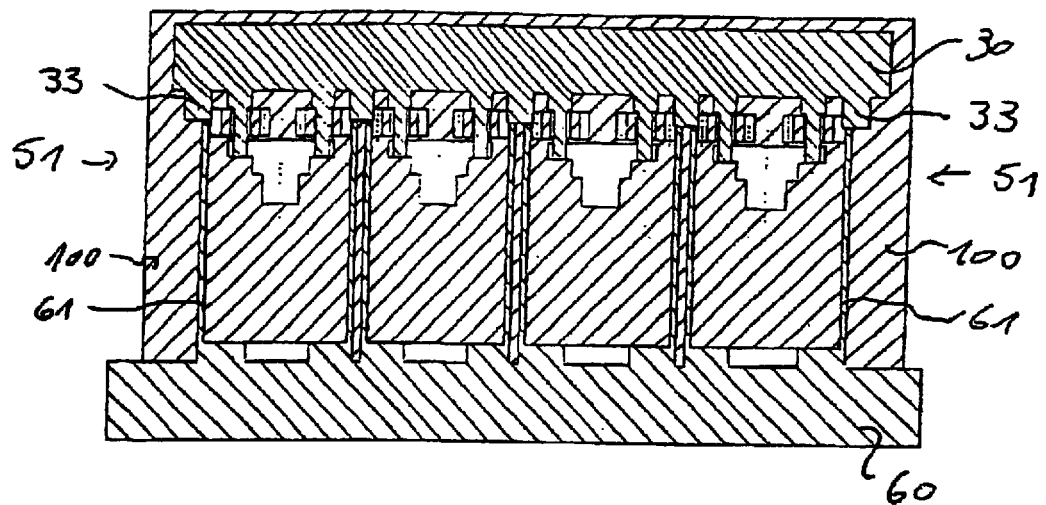
Figure 40:
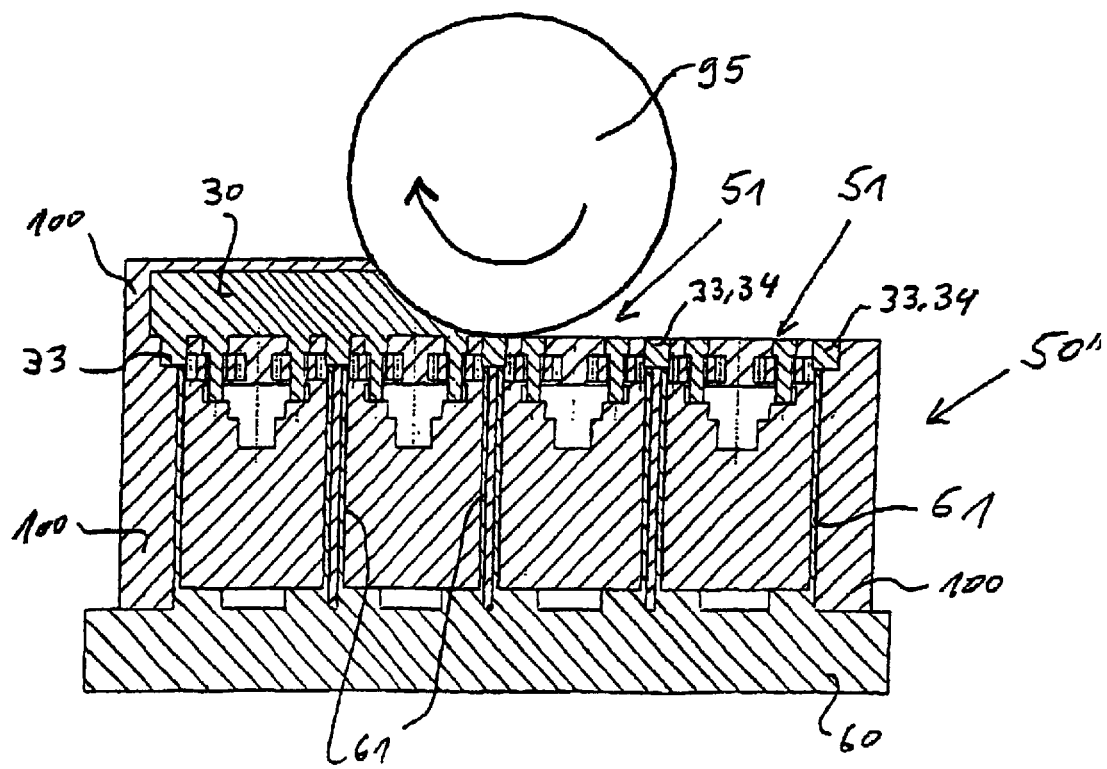

FIGS. 37–40 show a further embodiment in which bushings 61 are arranged on a cassette 60 and cassette 30 is provided with fixation pins 33, which hold planetary gears 21 in a predefined position. FIG. 38 illustrates the assembly of bushings 61, which corresponds to the process depicted in FIG. 34. FIG. 39 illustrates the embedding in fixation compound 100 and milling of the base plate of cassette 30, for which the entire system was rotated, so that now the component carrier of cassette 60 is located below. If additional assembly steps follow, fixation compound 100 is removed and cassette 60 forms the basic cassette for the subsequent steps.

The remaining parts 34 of fixation pins 33 are located in fixation compound 100, which forms the subassembly cassette 50'''.

Figure 41:
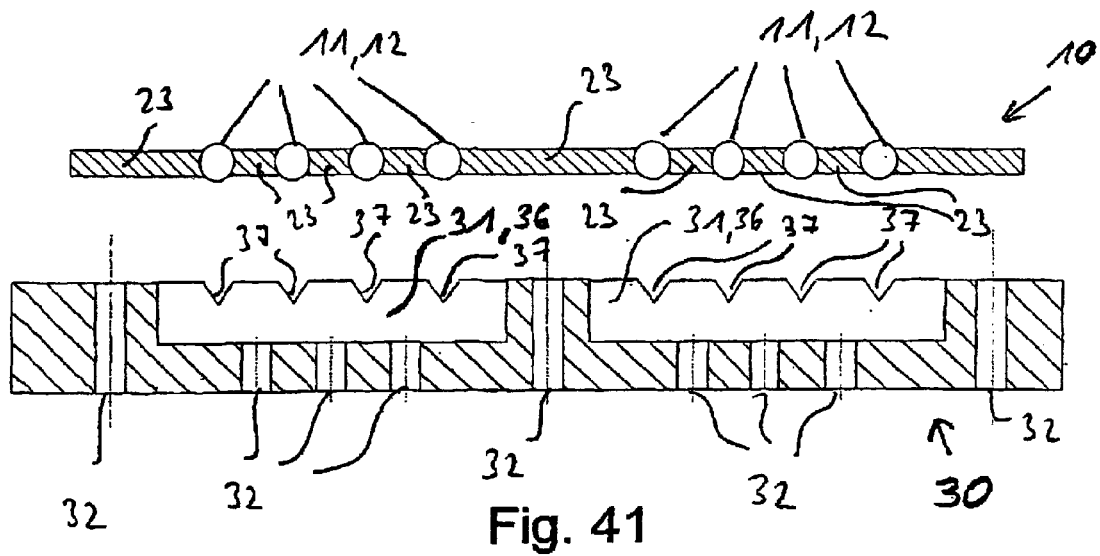
FIGS. 41–43 show the process steps for the assembly of fibers and connectors.
Figure 42:
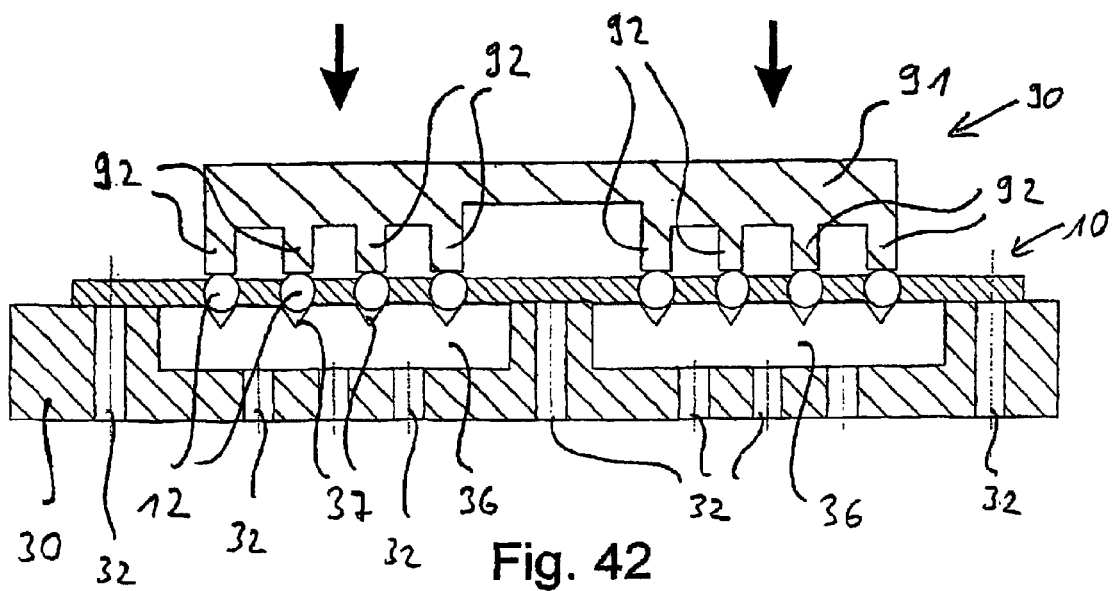
Figure 43:
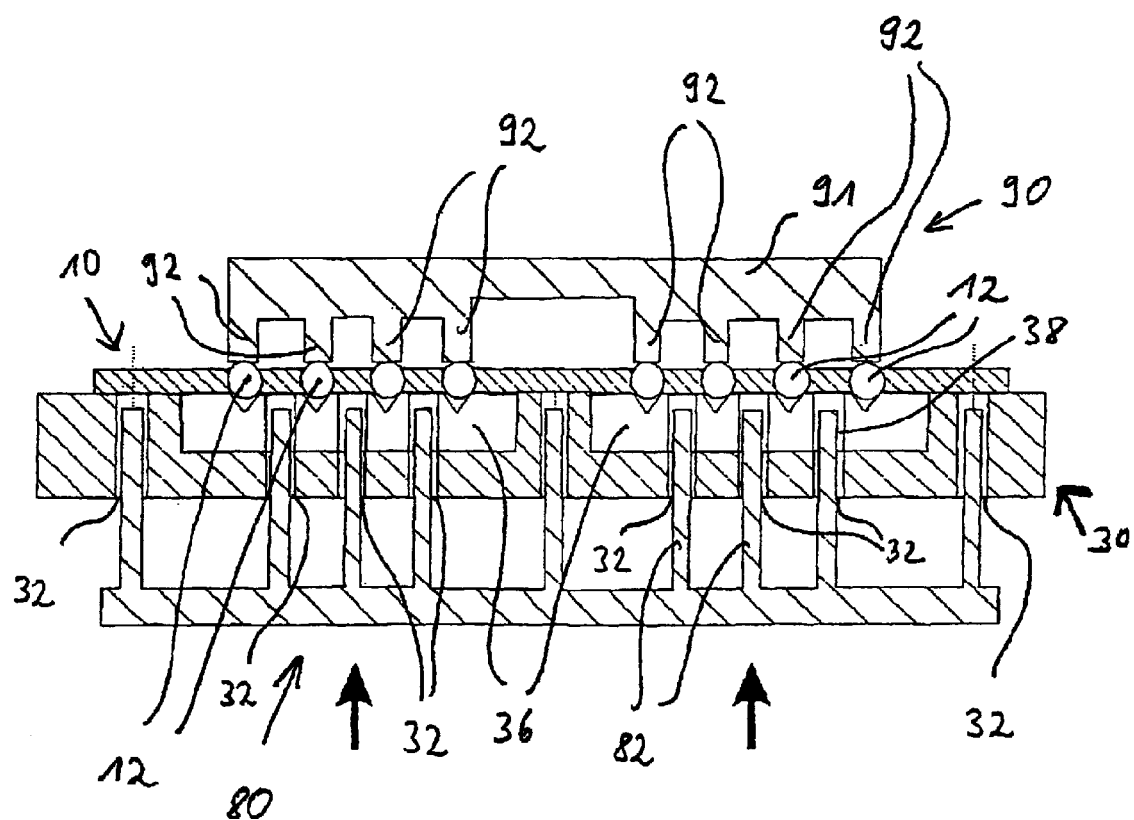

FIGS. 41–43 depict the assembly of optical fibers 12 with connector parts 36.

The microcomponents of a first type 11 in the form of fibers 12 are arranged with their end segments parallel to one another in a first foil cassette 10. The cassette sections between fibers 12 are referred to as webs 23.

Microcomponents 31 comprise connector parts 36, which are arranged in a base plate cassette 30. The topside of connector parts 36 is provided with grooves 37 into which fibers 12 are inserted. Base plate cassette 30 is provided with positioning and assembly holes 32.

As shown in FIG. 42, foil cassette 10 with fibers 12 is lowered onto base plate cassette 30. Since the distance between fibers 12 in cassette 10 corresponds to the distance between grooves 37, the fibers are positioned above grooves 37. The webs are thinner than the diameter of the fibers, so that the fibers fit inside grooves 37. Upper part 90 of the assembly device, which is provided with ejector elements 92 on its bottom side, is lowered from the top. These ejector elements are positioned at the points where the fibers are arranged in foil cassette 10. The distance between the ejector elements 92 corresponds to the distance between the fibers 12, which are arranged parallel to one another.

In the next step, which is depicted in FIG. 43, the lower part 80 of the assembly device, which is provided with a plurality of assembly pins 82, is approached from below. These assembly pins 82 are guided through positioning holes 32. The connector parts 36 are also provided with assembly holes 38, such that assembly pins 82 can engage with webs 23 of cassette 10 from below. Because the fibers are held in grooves 37 by means of ejector elements 92, webs 23 can be pushed in upward direction and thus be removed.

It is also possible to arrange these positioning holes 32 in base plate cassette 30 in front of or behind connector elements 36, such that corresponding assembly holes 38 in connector parts 36 can be eliminated. This is possible if foil cassette 10 protrudes also in longitudinal direction of fibers 12 relative to connector parts 36.

After assembly of the fibers in grooves 37 and after removal of webs 23 of foil cassette 10, base plate cassette 30 is removed according the process described above.

35 shaft
36 connector
37 fiber groove
38 assembly hole
40 second base plate cassette
50 subassembly cassette
50' subassembly cassette
50" subassembly cassette
51 subassembly
52 insertion opening
53 subassembly holder
60 bushing cassette
61 bushing
62 internal gear
70 perforated plate
71 opening
72 ejector pin
80 assembly device/lower part
81 base plate
82 assembly pin
83 assembly plate
84 hole
85 assembly pin
86 spacer
87 ejector pin
88 fixation pin
89 star shaped end

TABLE 1

Assembly Concept I

| First Modification | N | 1 | 2 | 3 | 4 | 5 | 6 | 7 | 8 | 9 | 10 | 11 | 12 | 13 |
|---|---|---|---|---|---|---|---|---|---|---|---|---|---|---|
| Vacuum casting | 2 | X | X | | | | | | | | | | | |
| Embedding in wax | 1 | | | | | | | | | | | X | | |
| Mechanical processing | 5 | | | X | X | X | X | | | | | | X | |
| Cleaning | 1 | | | | | | | | | | | | | X |
| Preparation of assembly | 1 | | | | | | | X | | | | | | |
| Assembly | 2 | | | | | | | | X | X | | | | |
| Welding | 1 | | | | | | | | | | X | | | |

TABLE 2

Assembly Concept II

| First Modification | N | 1 | 2 | 3 | 4 | 5 | 6 | 7 | 8 | 9 | 10 | 11 | 12 |
|---|---|---|---|---|---|---|---|---|---|---|---|---|---|
| Vacuum casting | 1 | X | | | | | | | | | | | |
| Embedding in wax | 2 | | | | | X | | | | | X | | |
| Mechanical processing | 4 | | X | X | | | X | | | | | X | |
| Cleaning | 2 | | | | | | | | X | | | | X |
| Preparation of assembly | 0 | | | | | | | | | | | | |
| Assembly | 2 | | | | X | | | | | X | | | |
| Welding | 1 | | | | | | | X | | | | | |

REFERENCE NUMERALS

10 first foil cassette
11 microcomponent of first type
12 fibers
20 second foil cassette
21 microcomponent of second type
22 component core
23 web
30 first base plate cassette
31 microcomponent of third type
32 positioning hole
33 fixation pin
34 fixation pin remnant
90 assembly device/upper part
91 base plate
92 ejector element
93 cassette holder
94 die
95 milling unit
96 fixation plate
97 welding device
100 fixation compound

What is claimed is:

1. A method for assembling cassette-loaded microcomponents of a plurality of component types into subassemblies or component units comprising the steps of:

using at least two cassettes with component carriers with at least one component type each and with mutually adjusted component positions each, of which at least one cassette is a base plate cassette in which the microcomponents are arranged on a base plate as the component carrier;

performing at least one assembly step in which two cassettes are arranged on opposite sides, respectively, and a plurality of microcomponents of the two cassettes are simultaneously assembled into subassemblies or component units; and subsequently removing the component carriers of the cassettes.

2. A method according to claim 1, wherein at least one base plate cassette is used as a basic cassette, and the base plate is removed after at least one assembly step has been completed.

3. A method according to claim 1, wherein at least one foil cassette is used in which the cassette material carrying the microcomponents forms the component carrier.

4. A method according to claim 3, wherein, prior to the foil cassette being arranged, component cores are removed from the micro-components.

5. A method according to claim 3, wherein the microcomponents of the foil cassette in the cassette system are pressed onto the micro-components of the opposite cassette and the component carrier of the foil cassette is subsequently detached from the microcomponents.

6. A method according to claim 1, wherein, if base plate cassettes are used, these cassettes are pressed against one another to assemble the microcomponents.

7. A method according to claim 1, wherein the assembled microcomponents are embedded in a fixation compound and the base plate of one of the at least one base plate cassette is subsequently removed.

8. A method according to claim 7, wherein the base plate is removed by milling, turning or grinding.

9. A method according to claim 7, wherein the fixation compound is removed and additional microcomponents from other cassettes are mounted on the subassemblies located on the base plate of the basic cassette.

10. A method according to claim 1, wherein the subassemblies located on the base plate of the basic cassette are embedded in a fixation compound so as to form a subassembly cassette and the base plate of the basic cassette is removed.

11. A method according to claim 10, wherein the subassembly cassette is a foil cassette.

12. A method according to claim 1, wherein at least a portion of the assembled microcomponents is secured against rotation.

13. A method according to claim 12, wherein the microcomponents are secured by means of fixation structures located on the base plate of the basic cassette or by means of fixation structures of an assembly device, or a combination thereof.

14. A method according to claim 12, wherein the microcomponents are secured against rotation until the subassemblies or component units are completed.

15. An assembly device for assembling cassette-loaded microcomponents of a plurality of component types into subassemblies or component units comprising:

a lower part with an assembly plate, which is configured to receive a base plate cassette, wherein assembly pins are arranged in the assembly plate and are movable perpendicularly to the plate surface; and a movable upper part comprising fastening means for a base plate cassette or a foil cassette.

16. A device according to claim 15, wherein the assembly pins are provided with fixation structures at least in their end areas.

17. A device according to claim 15, wherein the upper part is provided with ejector elements.

* * * * *